(12) United States Patent
Jang et al.

(10) Patent No.: US 7,875,540 B2
(45) Date of Patent: Jan. 25, 2011

(54) METHOD FOR MANUFACTURING RECESS GATE IN A SEMICONDUCTOR DEVICE

(75) Inventors: Se-Aug Jang, Ichon-shi (KR); Heung-Jae Cho, Ichon-shi (KR); Tae-Yoon Kim, Ichon-shi (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/458,059

(22) Filed: Jun. 30, 2009

(65) Prior Publication Data

US 2009/0269917 A1 Oct. 29, 2009

Related U.S. Application Data

(62) Division of application No. 11/646,282, filed on Dec. 28, 2006, now Pat. No. 7,579,265.

(30) Foreign Application Priority Data

Sep. 29, 2006 (KR) ...................... 10-2006-0096334

(51) Int. Cl.
*H01L 21/00* (2006.01)
(52) U.S. Cl. .............................. 438/589; 257/E21.176
(58) Field of Classification Search ......... 438/585–595; 257/E21.176
See application file for complete search history.

(56) References Cited

U.S. PATENT DOCUMENTS 6,476,444 B1 11/2002 Min
6,861,701 B2 3/2005 Williams et al.
2001/0009800 A1 7/2001 Hijzen et al.
2006/0049455 A1 3/2006 Jang et al.
2006/0216885 A1 9/2006 Lee

FOREIGN PATENT DOCUMENTS

JP 2006-173429 6/2006
KR 10-2005-0027381 3/2005
KR 10-2006-0062358 6/2006

OTHER PUBLICATIONS

Notice of Allowance issued from Chinese Patent Office on Feb. 17, 2010.
English-language translation of the Notification of First Office Action from the State Intellectual Property Office of the People's Republic of China mailed Jan. 16, 2009, in Chinese Patent Application No. 2007100900448.

*Primary Examiner*—Richard A. Booth
(74) *Attorney, Agent, or Firm*—IP & T Group LLP

(57) ABSTRACT

A method for manufacturing a recess gate in a semiconductor device includes forming a field oxide layer on a substrate to define an active region, forming a hard mask pattern over the substrate to selectively expose at least a portion of the active region, forming a recess pattern in the active region through an etching process using the hard mask pattern as an etch barrier, removing the hard mask pattern, forming a gate insulating layer over the substrate, and forming a gate electrode over the gate insulating layer to cover at least the recess pattern.

12 Claims, 24 Drawing Sheets

FIG. 1B
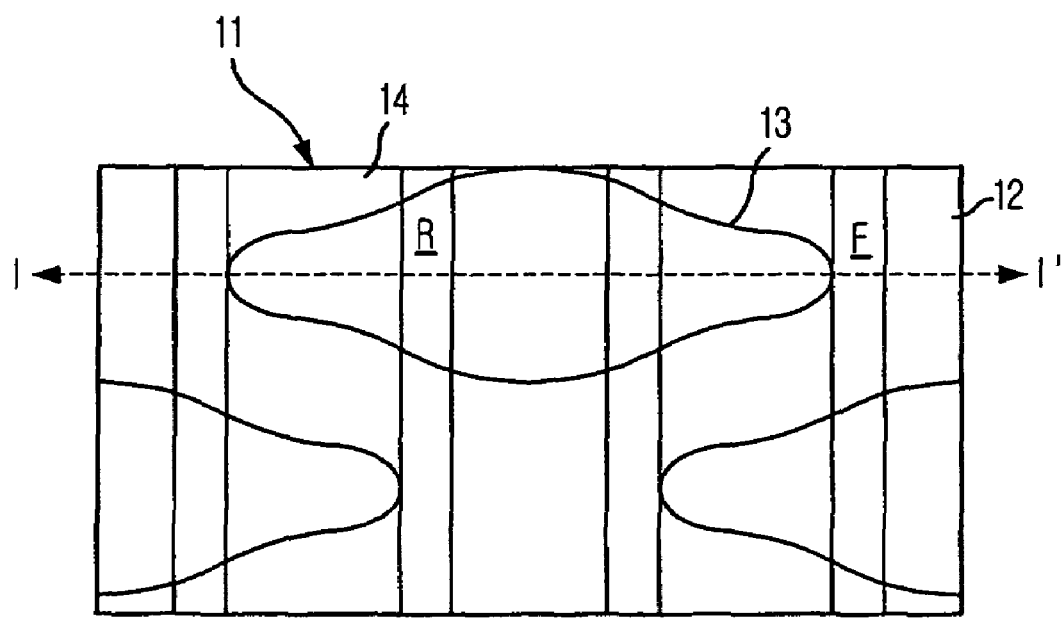
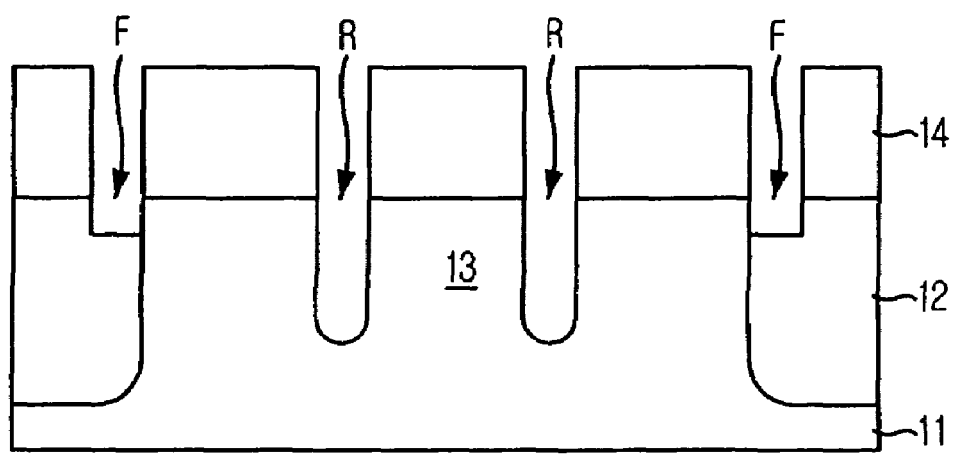

FIG. 1C
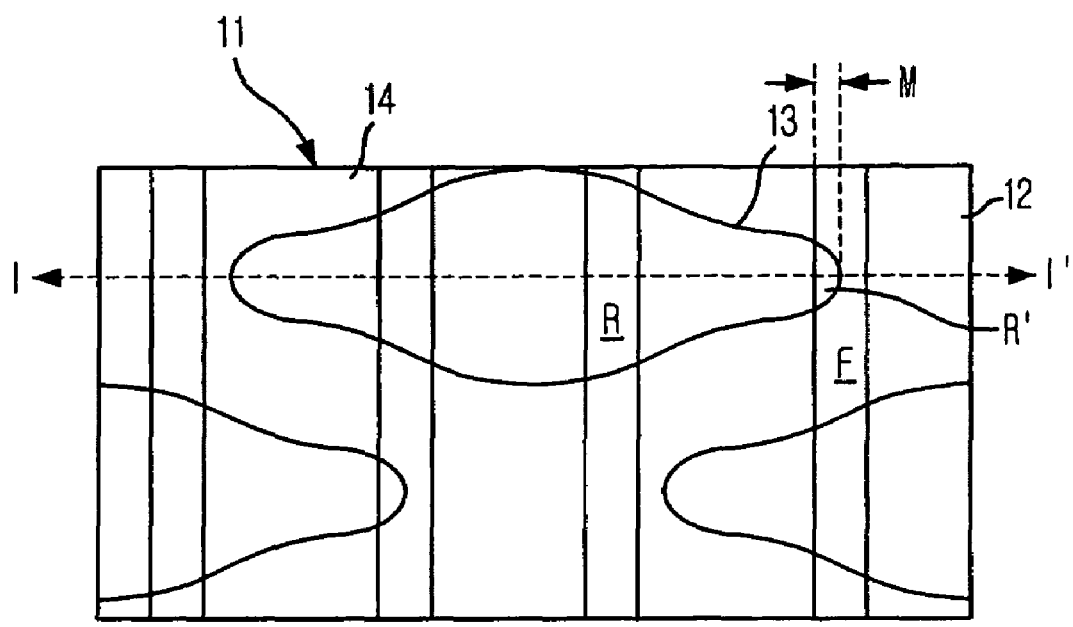
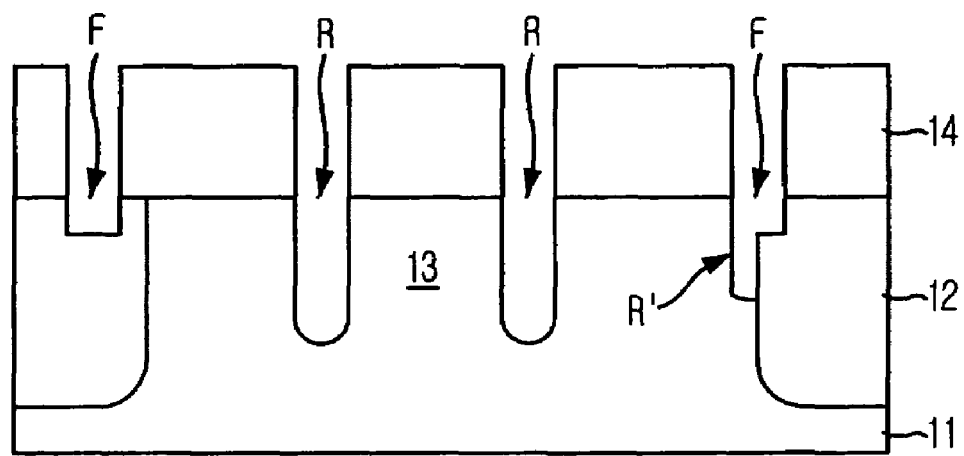

FIG. 1D
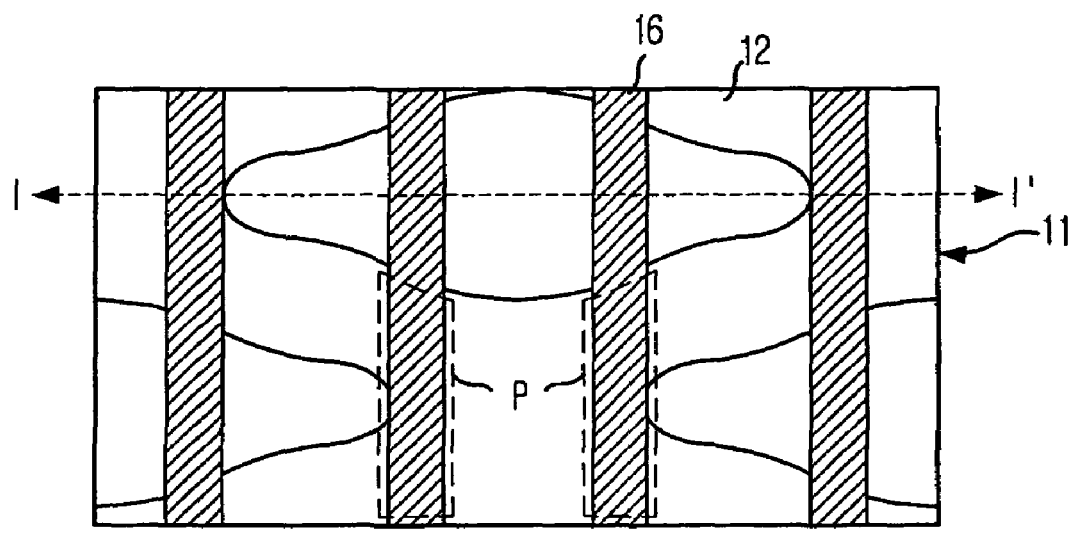
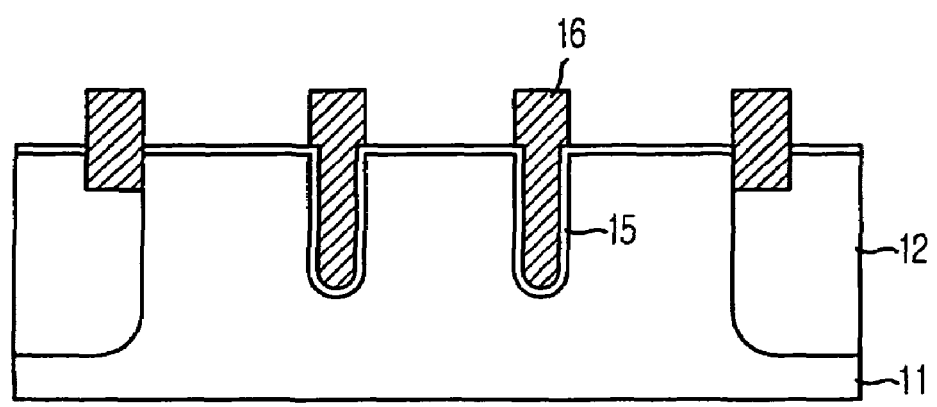

FIG. 2D
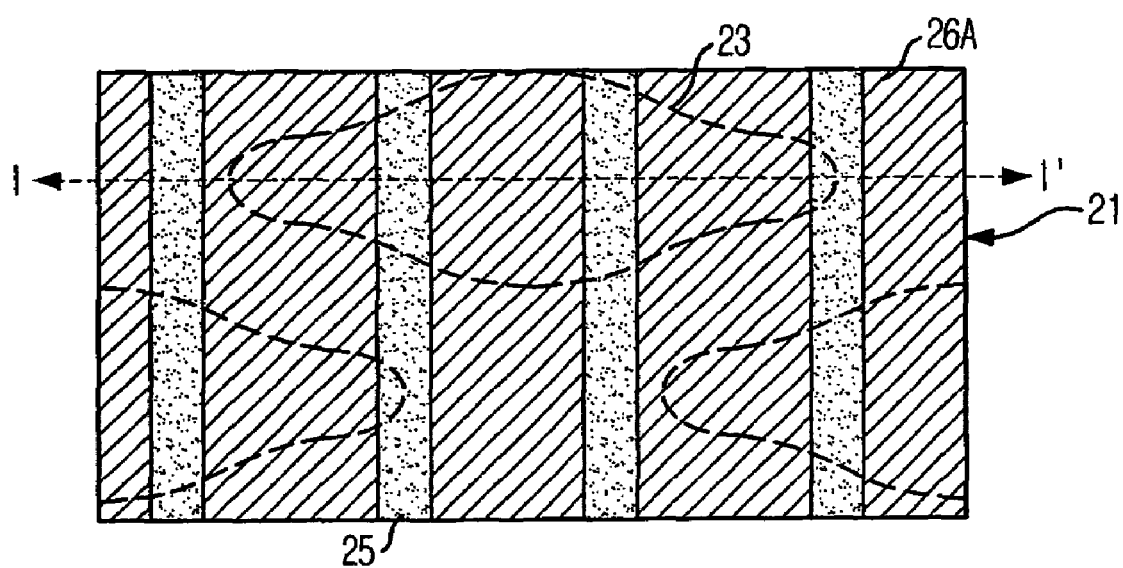
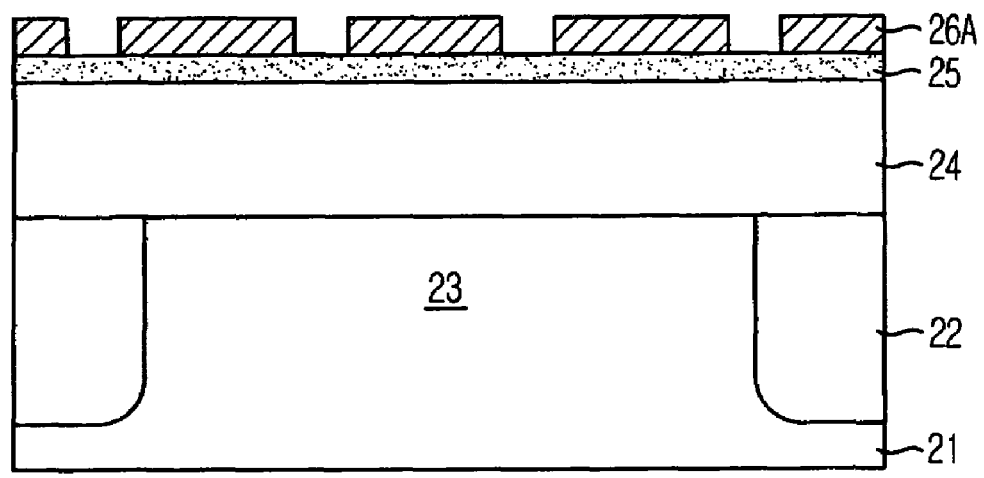

FIG. 2F
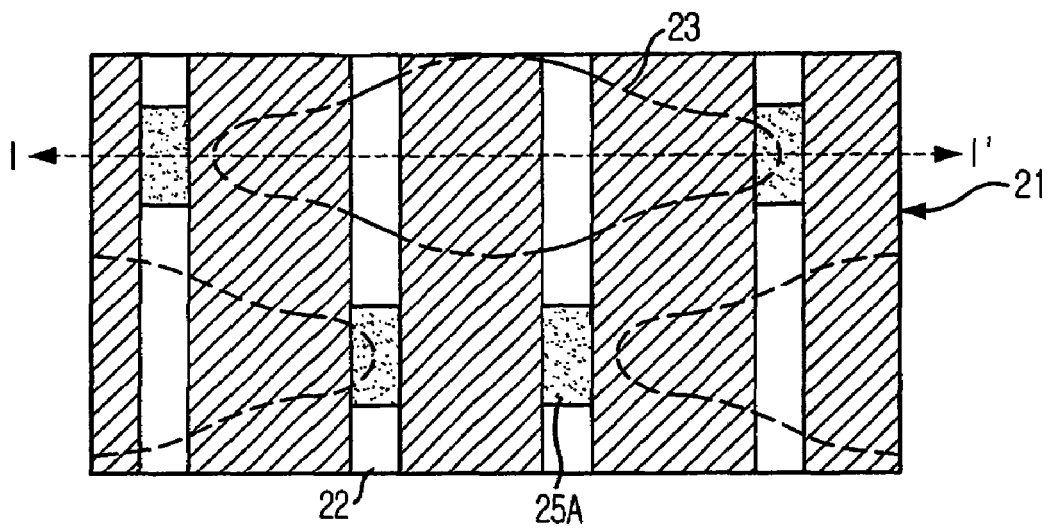
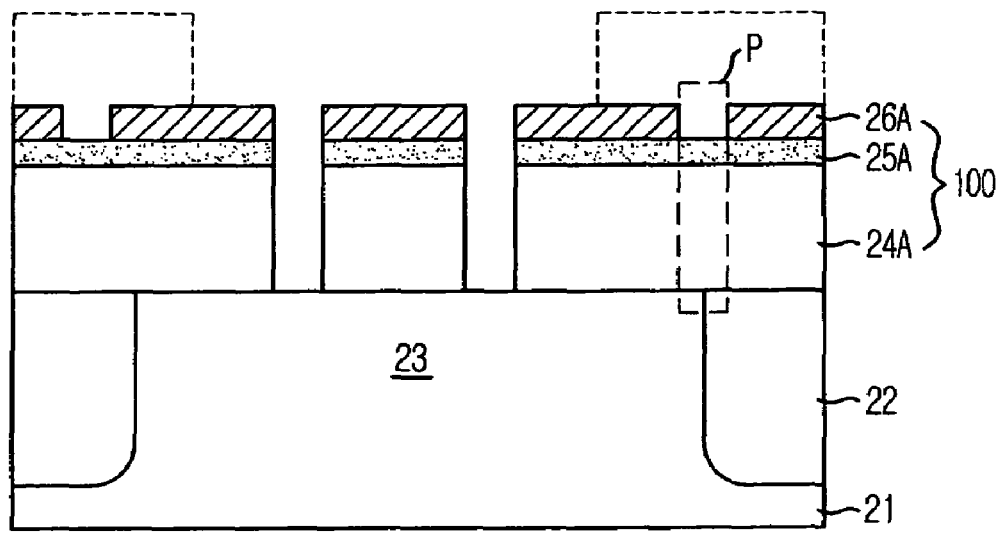

FIG. 2G
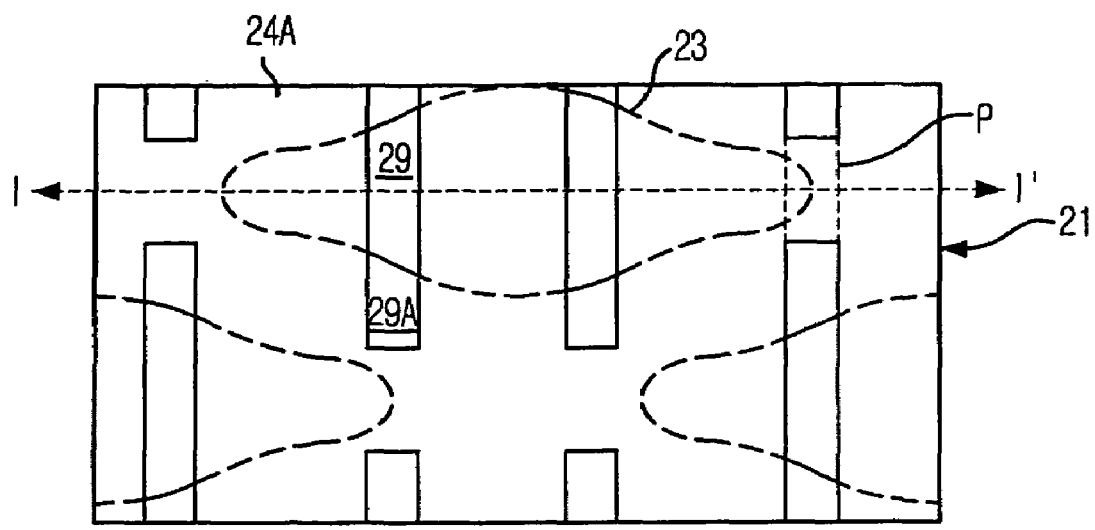
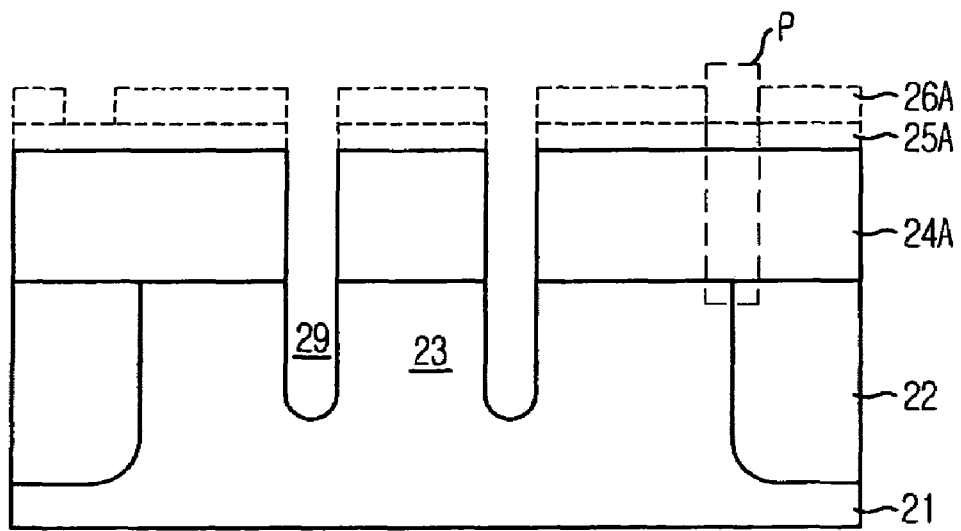

FIG. 2H
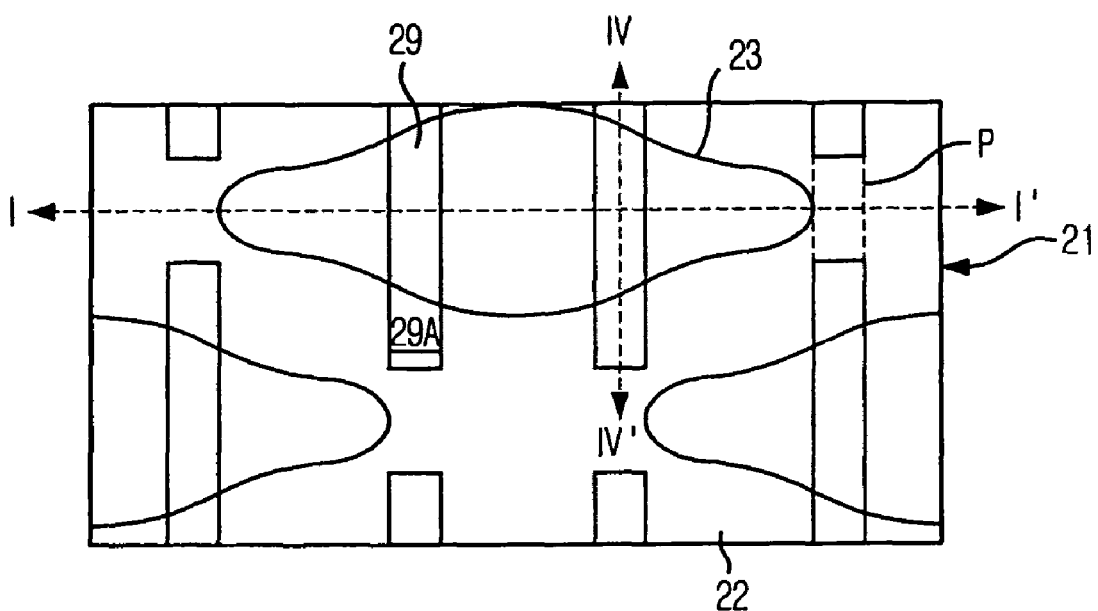
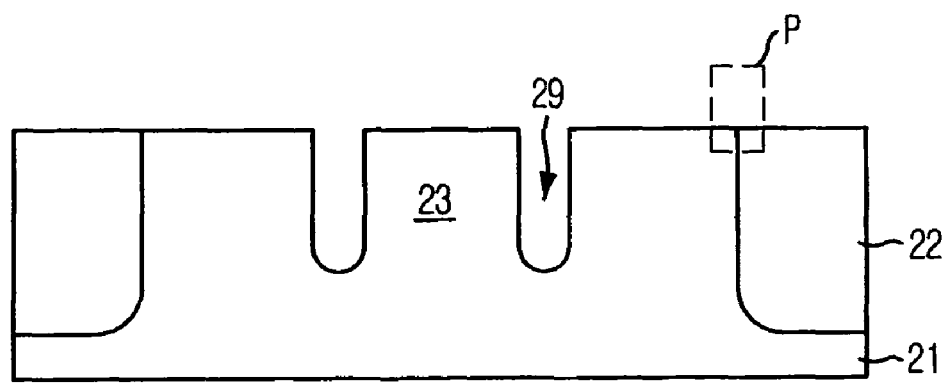

FIG. 4D
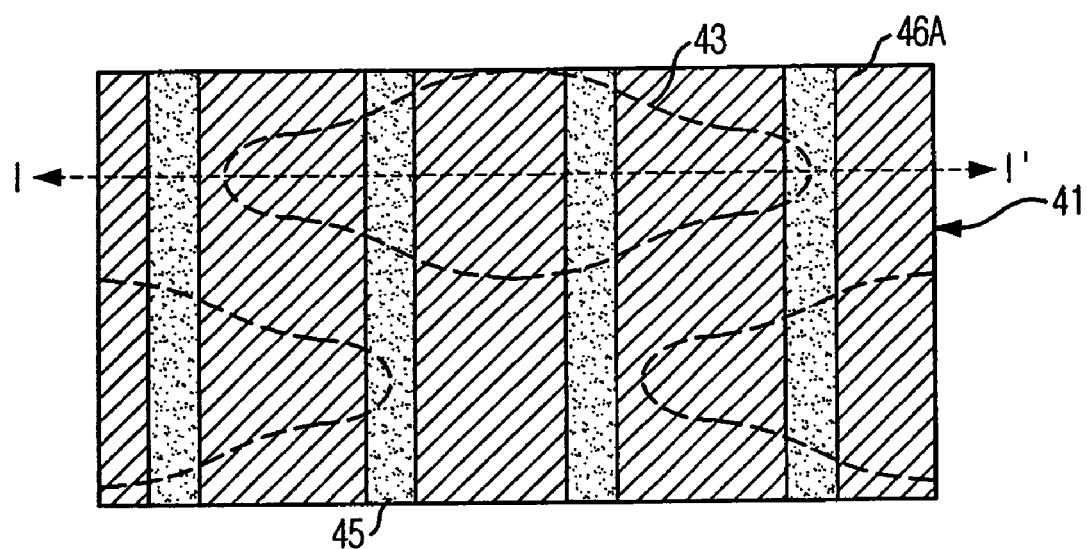
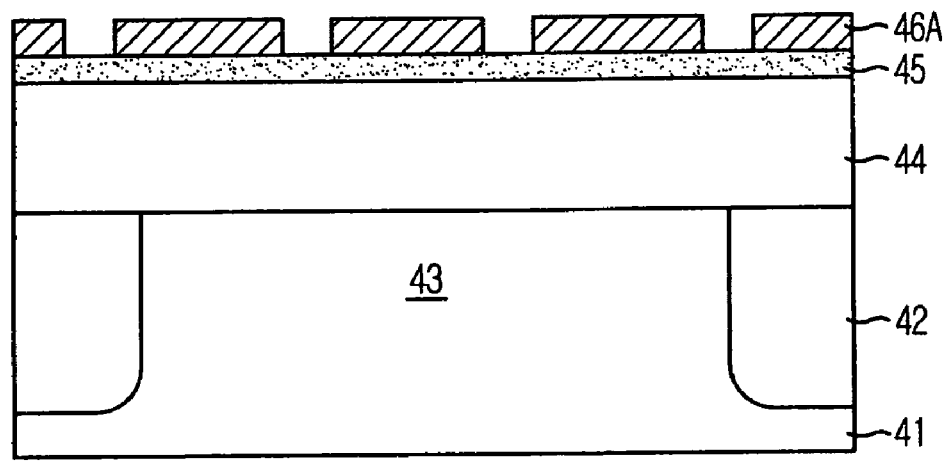

FIG. 4F
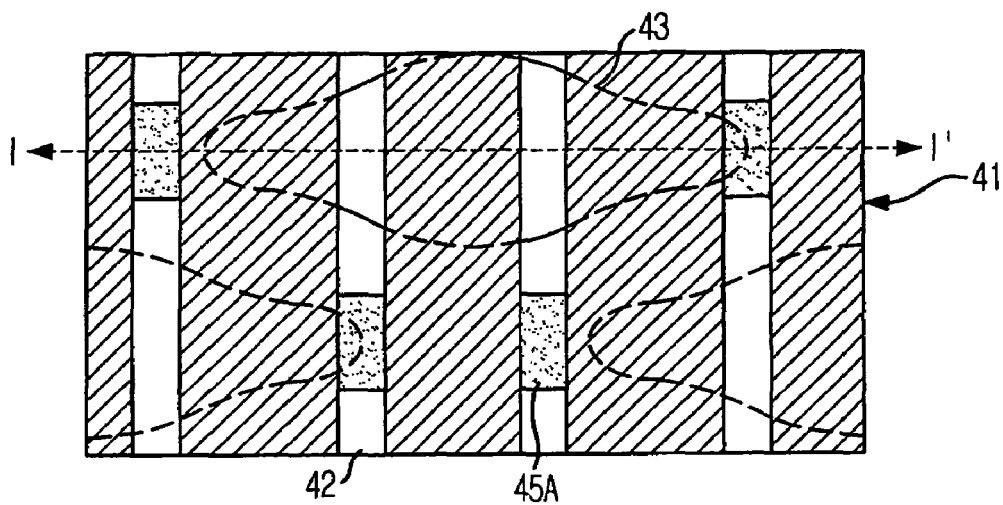
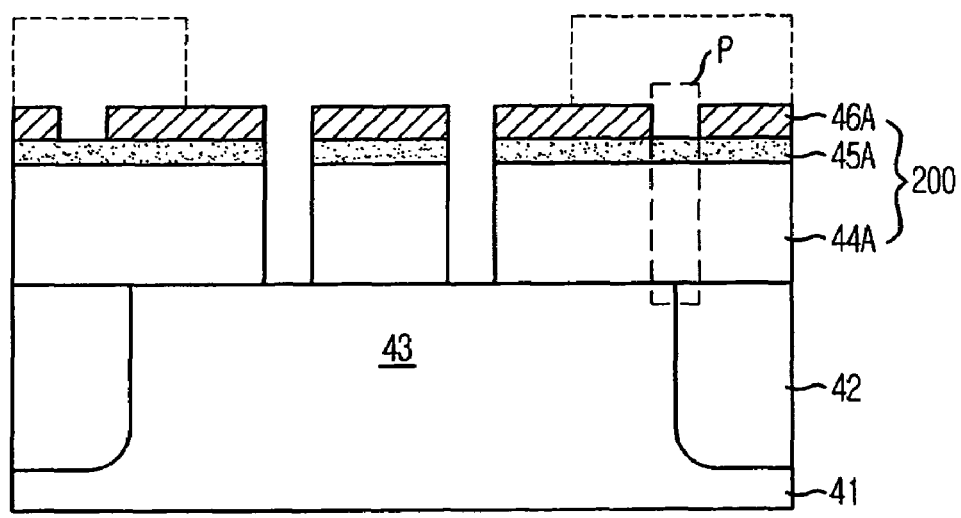

FIG. 4G
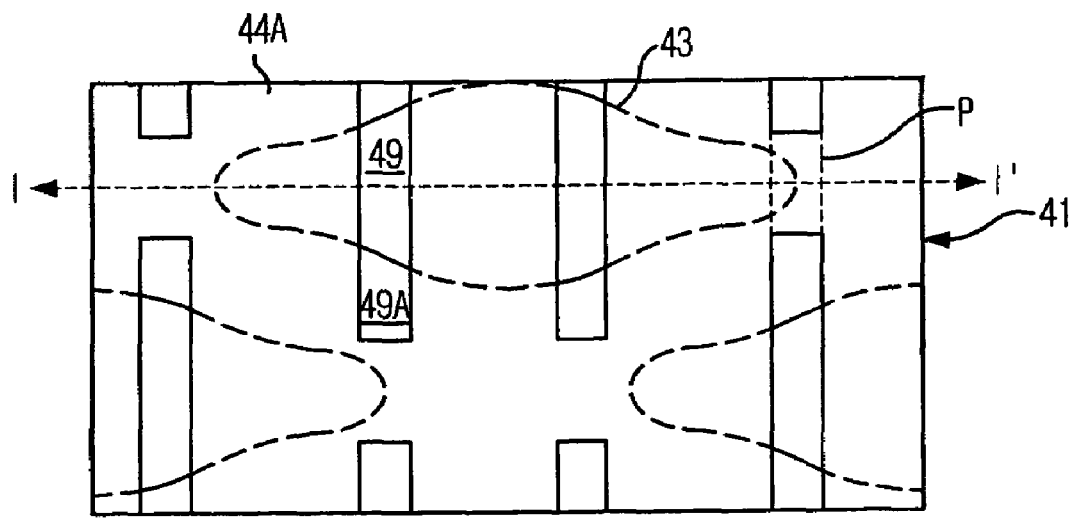
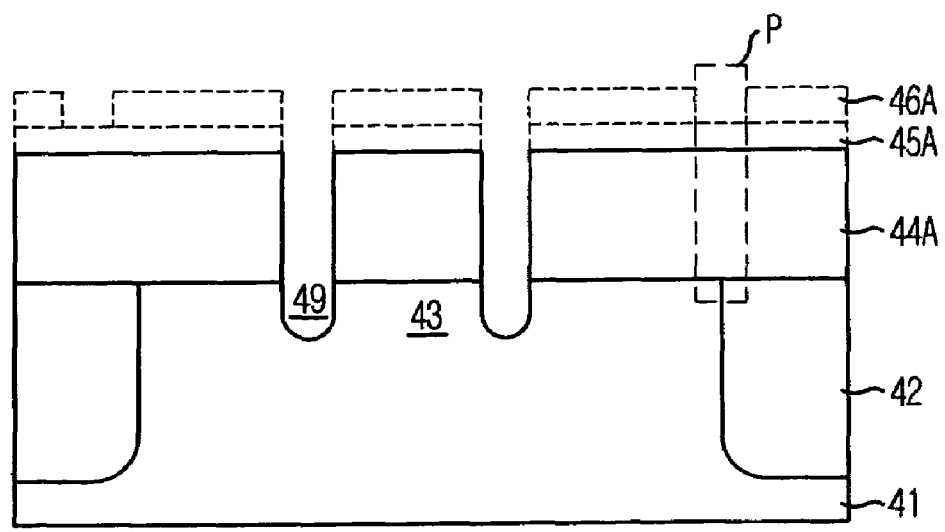

FIG. 4H
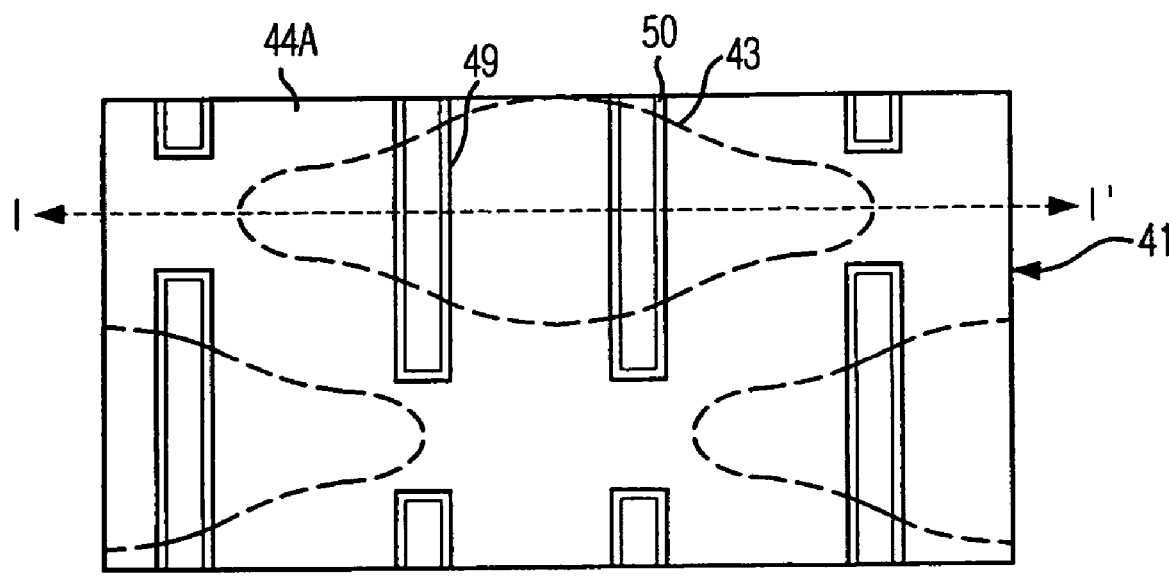
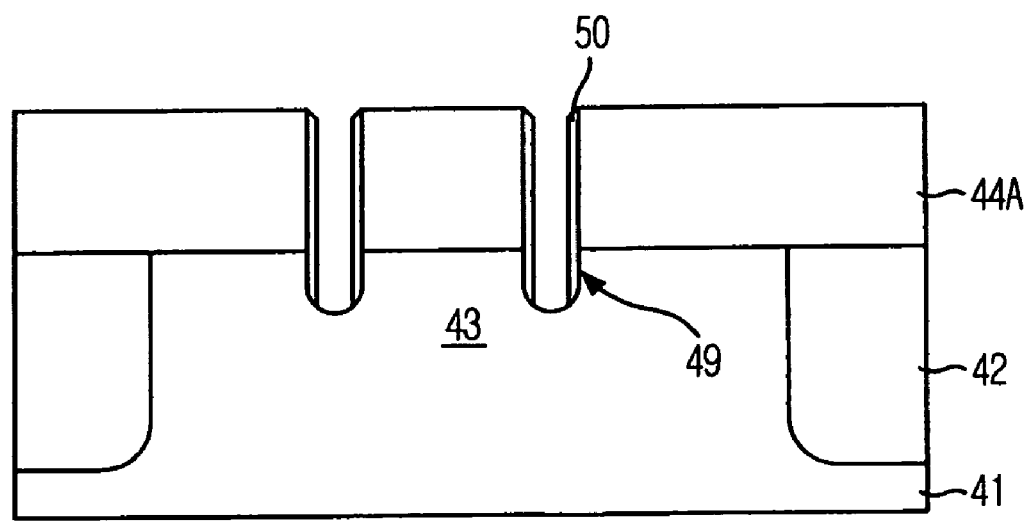

FIG. 41
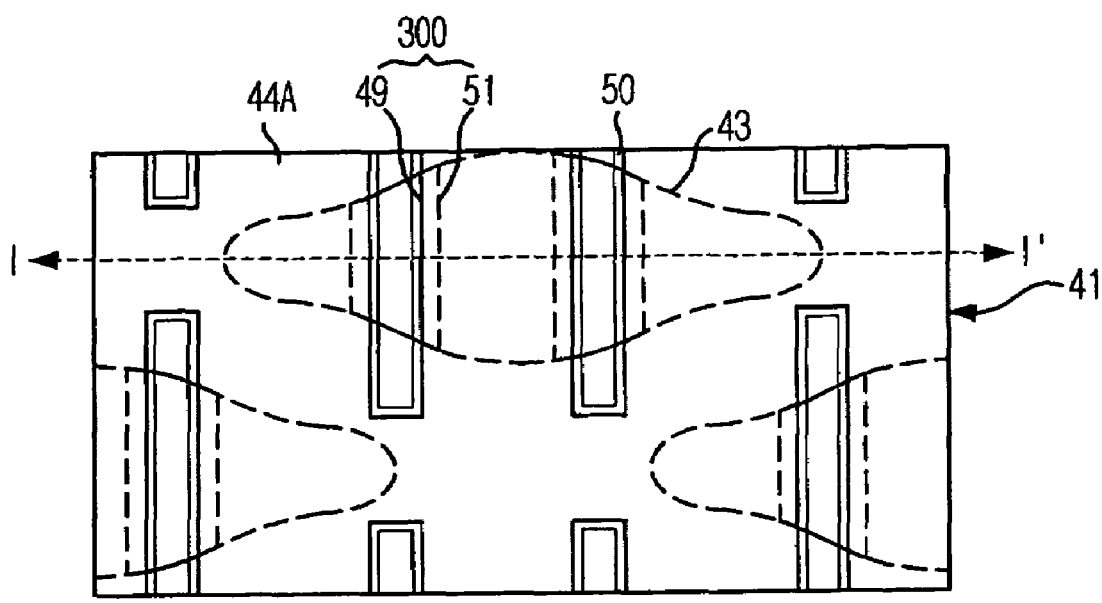
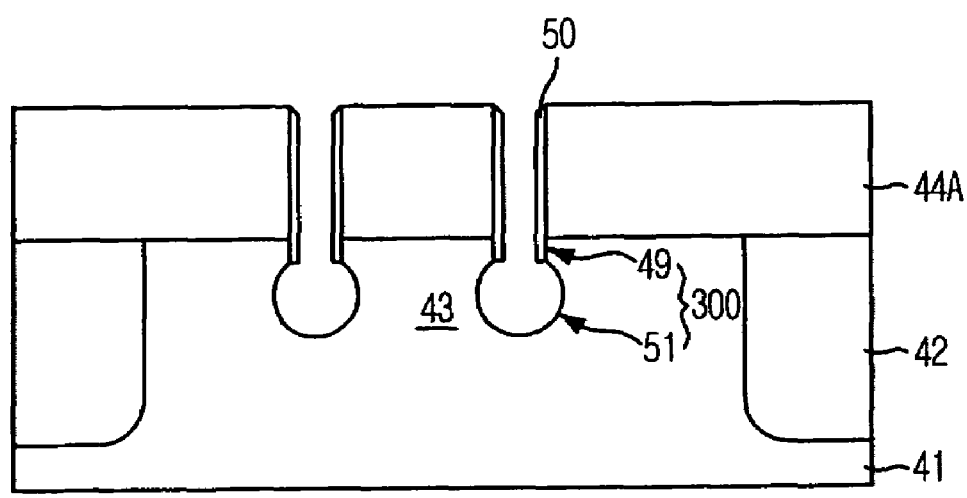

FIG. 4J
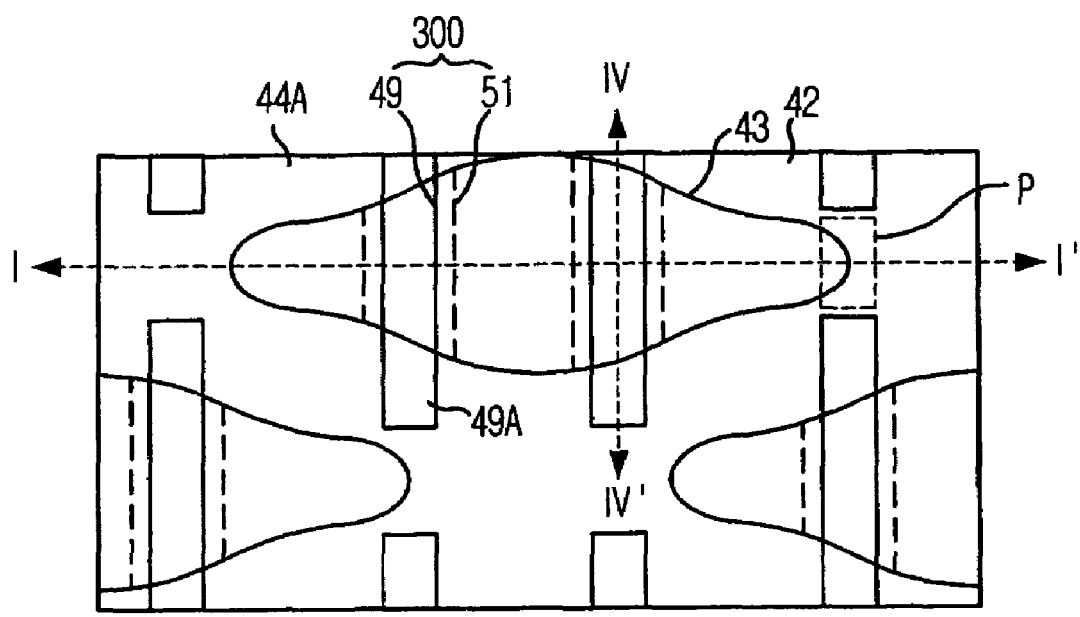
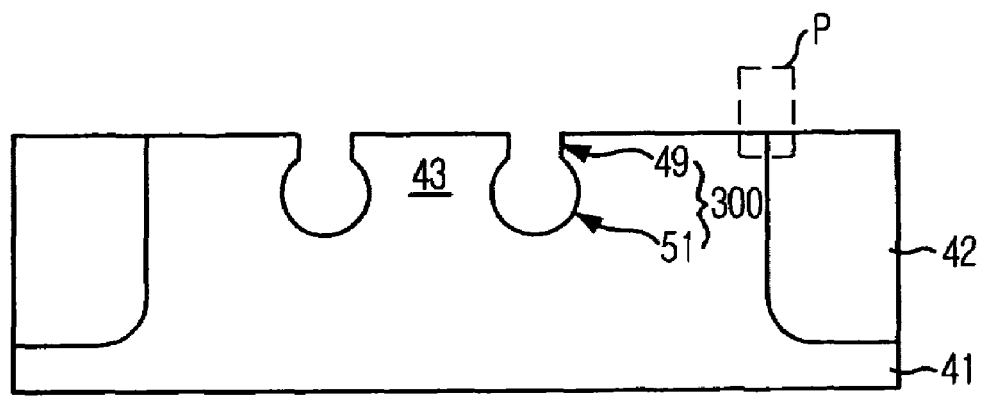

US 7,875,540 B2

METHOD FOR MANUFACTURING RECESS GATE IN A SEMICONDUCTOR DEVICE

RELATED APPLICATION

This application is a divisional of U.S. application Ser. No. 11/646,282, filed Dec. 28, 2006, now U.S. Pat. No. 7,579,265, the entire contents of which are incorporated herein by reference. In addition, this application claims the benefit of priority to Korean patent application number 10-2006-0096334, filed in the Korean Patent Office on Sep. 29, 2006, which is incorporated herein by reference in its entirety.

BACKGROUND

1. Technical Field

The present invention generally relates to a method for manufacturing a semiconductor device, and more specifically, to a method for manufacturing a recess gate in a semiconductor device.

2. Description of the Related Art

As semiconductor devices become highly integrated, transistor channel lengths are correspondingly shortened. Due to the shortening of the channel length, a short channel effect abruptly lowers threshold voltages more seriously in a conventional planar transistor.

In addition, an electric field of a substrate becomes very high due to the excessive ion implantation as memory devices such as a dynamic random access memory (DRAM) become increasingly integrated. In particular, a junction leakage current increases at a junction of a storage node contact SNC, which leads to a limitation of reduction of data retention time.

In order to overcome this limitation, a recess gate process has been widely used in recent years, by which a silicon substrate is recessed to a certain depth and a cell transistor of DRAM is then formed. As a result, the junction leakage current is reduced, increasing the data retention time.

FIGS. 1A and 1B illustrate a conventional method for manufacturing a recess gate. FIG. 1C illustrates an overlay misalignment between an active region and a recess pattern, and FIG. 1D illustrates a resultant structure after forming a gate insulating layer and a gate electrode. In FIGS. 1A to 1D, top diagrams are plan views and bottom diagrams are sectional views taken along line I-I' of the top diagrams.

Referring to FIG. 1A, a field oxide layer 12 is formed on a substrate 11 using a shallow trench isolation (STI) process, defining an active region 13. Referring to FIG. 1B, a recess mask 14 having a straight line pattern with spacing therebetween is formed over the resultant structure. Active region 13 of substrate 11 is dry-etched to a certain depth using recess mask 14 as an etch barrier, thereby forming a recess pattern R. However, due to imperfect etch selectivity between active region 13 and field oxide layer 12, a portion of field oxide layer 12 is inevitably recessed, denoted in FIG. 1B, while etching active region 13 to form a recess pattern R.

A recessed portion F of field oxide layer 12 is expanded and enlarged even more while field oxide layer 12 undergoes various cleaning processes using hydrofluoric acid (HF) based solution, whereby the reliability of the device is degraded. In addition, if there exists an overlay misalignment M (see FIG. 1C) between active region 13 and recess pattern R, a portion of active region 12 is undesirably etched (see R' in FIG. 1C). That is, active region 13 is physically damaged due to overlay misalignment M. Thus, in order to prevent physical damage to active region 13, an accurate overlay between active region 13 and recess pattern R must be achieved to prevent the deterioration of device characteristics.

FIG. 1D illustrates a resultant structure after forming a gate insulating layer 15 and a gate electrode 16. Here, a gate passing over recess pattern R is referred to as a recess gate, and a portion of the recess gate passing over field oxide layer 13 is referred to as a passing gate. By performing the recess gate process, a channel length increases due to recess pattern R, and thus the recess pattern is also called a recess channel.

The gate passing over recessed portion F of field oxide layer 12, i.e., a passing gate P, has an effect on a storage node SN of the adjacent active region so as to deteriorate the device characteristics, e.g., data retention time. As the field oxide layer, over which passing gate P passes, is damaged, i.e., the recessed portion of field oxide layer 13 is deepened, and the device characteristic is deteriorated.

The limitation caused by the passing gate as described above also exists in a bulb-shaped recess gate which has been proposed recently to maximize advantages of the recess gate process. When a misalignment occurs while recessing the bulb-shaped recess gate, an active region around a field oxide layer, i.e., a region where the storage node will be formed, is eventually damaged.

SUMMARY

Embodiments of the present invention provide a method for manufacturing a recess gate in a semiconductor device capable of preventing damage to a field oxide layer under a passing gate in a recess gate process, and also preventing physical damage to an active region where a storage node is formed even if a partial overlay misalignment exists between the active region and a recess pattern.

Other embodiments of the present invention provide a method for manufacturing a bulb-shaped recess gate in a semiconductor device capable of preventing physical damage to an active region where a storage node is formed even if a partial overlay misalignment exists between the active region and a recess pattern.

An embodiment consistent with the present invention provides a method for manufacturing a recess gate in a semiconductor device, the method including: forming a device isolation structure on a substrate to define an active region; forming a hard mask pattern over the substrate to selectively expose at least a portion of the active region; forming a recess pattern in the active region through an etching process using the hard mask pattern as an etch barrier; removing the hard mask pattern; forming a gate insulating layer over the substrate; and forming a gate electrode over the gate insulating layer to cover at least the recess pattern.

Another embodiment consistent with the present invention provides a method for manufacturing a recess gate in a semiconductor device, the method including: forming a device isolation structure on a substrate to define an active region; forming a hard mask pattern over the substrate to selectively expose at least a portion of the active region; forming a neck pattern in the active region through an etching process using the hard mask pattern as an etch barrier; forming a sacrificial sidewall on sidewalls of the neck pattern and the hard mask pattern; forming a bulb pattern under the neck pattern through an etching process using the hard mask pattern; removing the sacrificial sidewall and the hard mask pattern; forming a gate insulating layer over the substrate; and forming a gate electrode over the gate insulating layer to fill at least the neck pattern and the bulb pattern.

BRIEF DESCRIPTION OF THE DRAWINGS

FIGS. 1A and 1B illustrate a conventional method for manufacturing a recess gate.

FIG. 1C illustrates an overlay misalignment between an active region and a recess pattern in the conventional method.

FIG. 1D illustrates a resultant structure after forming a gate insulating layer and a gate electrode in the conventional method.

FIGS. 2A to 2H illustrate a method for manufacturing a recess gate consistent with an embodiment of the present invention.

FIG. 2I illustrates a gate electrode formed in an embodiment consistent with the present invention.

FIGS. 4A to 4J illustrate a method for manufacturing a bulb-shaped recess gate consistent with another embodiment of the present invention.

DETAILED DESCRIPTION

An embodiment consistent with the present invention provides a method for manufacturing a recess gate in a semiconductor device, wherein damage to a field oxide layer under a passing gate can be prevented in a recess gate process, and physical damage to an active region where a storage node is formed can also be prevented even if a partial overlay misalignment exists between an active region and a recess pattern.

FIGS. 2A to 2H illustrate a method for manufacturing a recess gate consistent with an embodiment of the present invention. In FIGS. 2A to 2H, top diagrams are plan views and bottom diagrams are sectional views taken along the line I-I' of the plan view.

Figure 1A:
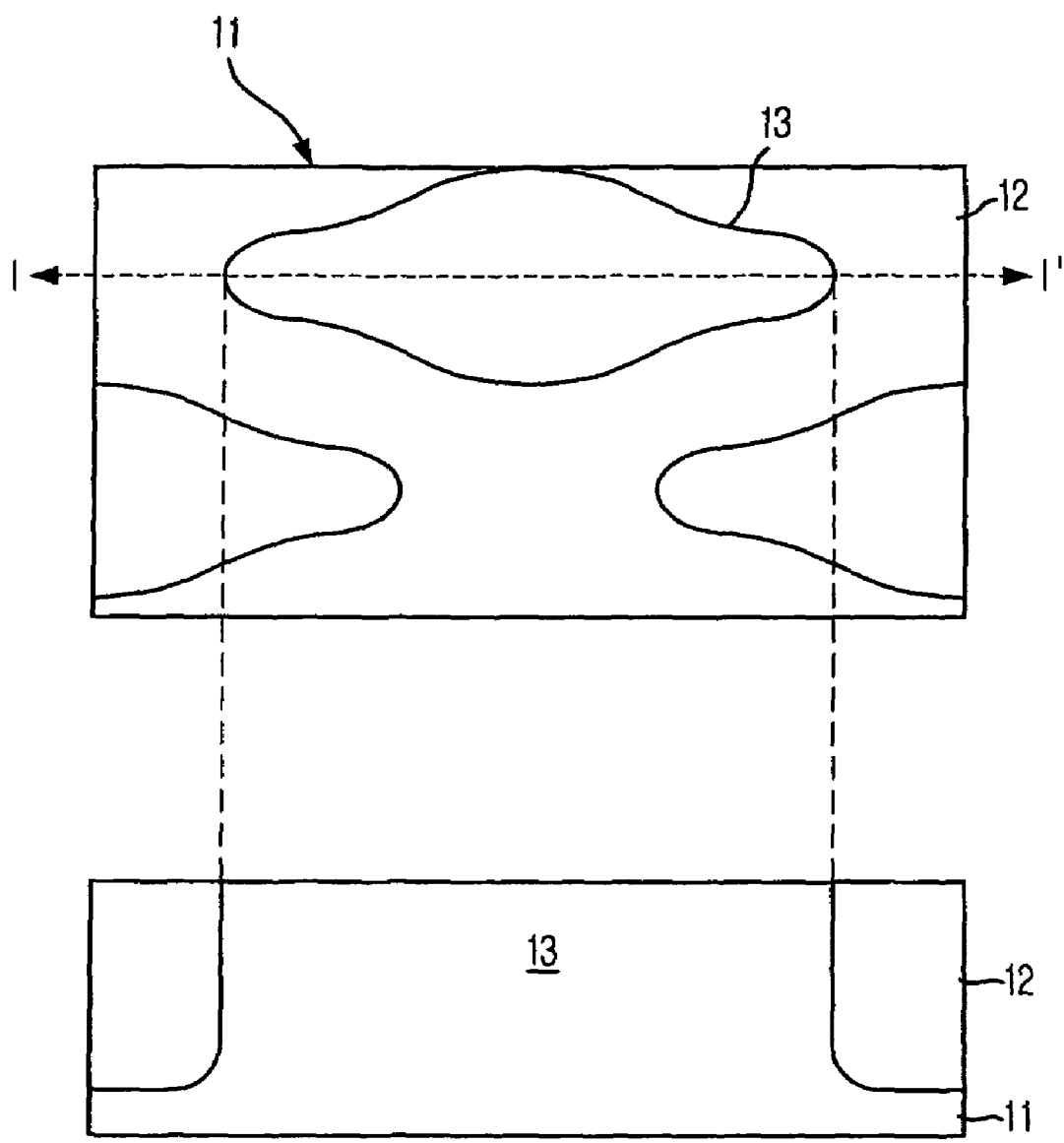
Figure 2A:
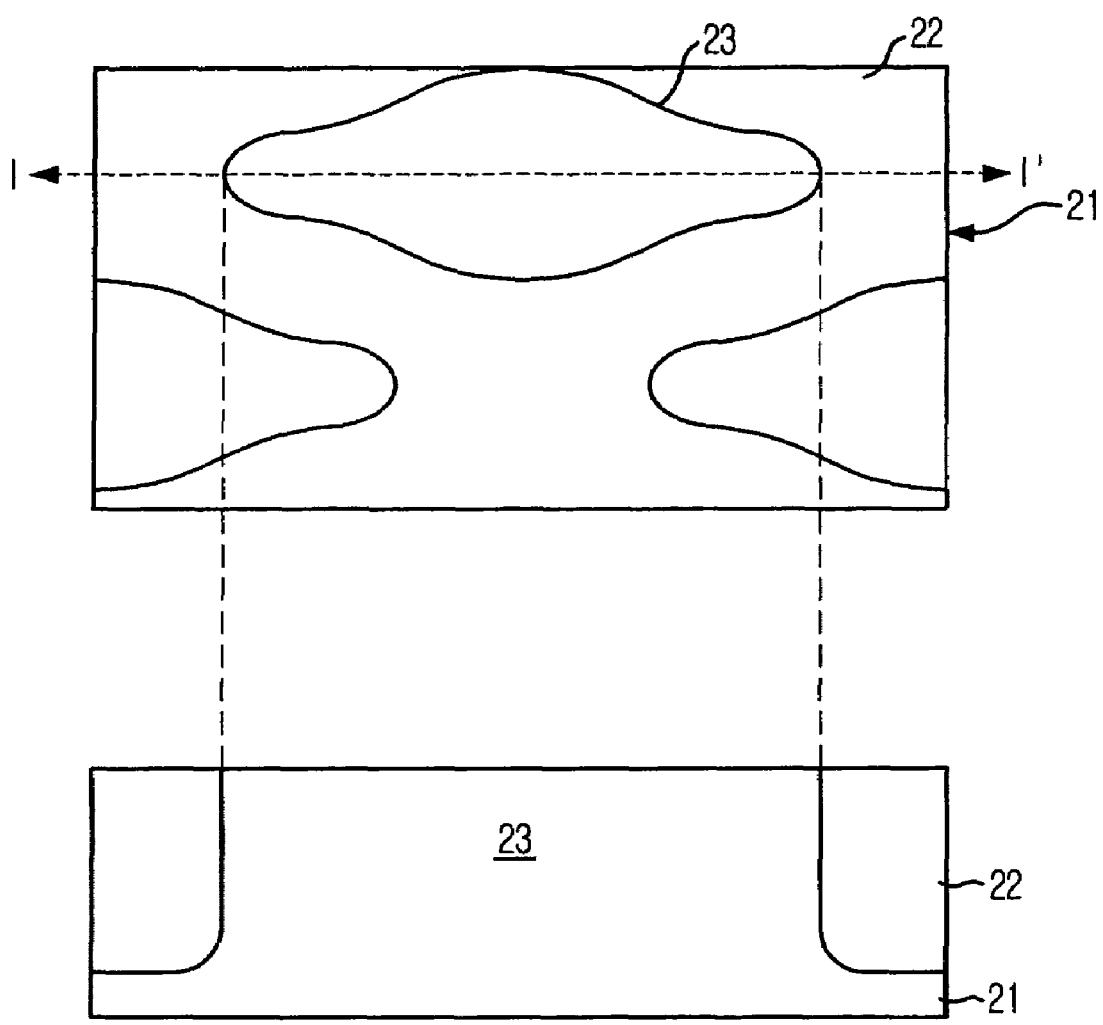

Referring to FIG. 2A, a field oxide layer 22 is formed on a substrate 21 using a shallow trench isolation (STI) process. The field oxide layer 22 functions as a device isolation structure. Field oxide layer 22 defines an active region 23, wherein active region 23 is formed in the shape of an island having a major axis and a minor axis. In the plan view, line I-I' is parallel to the major axis of active region 23, and a recess gate passes over active region 23 in the minor axis direction, which will be illustrated later.

Figure 2B:
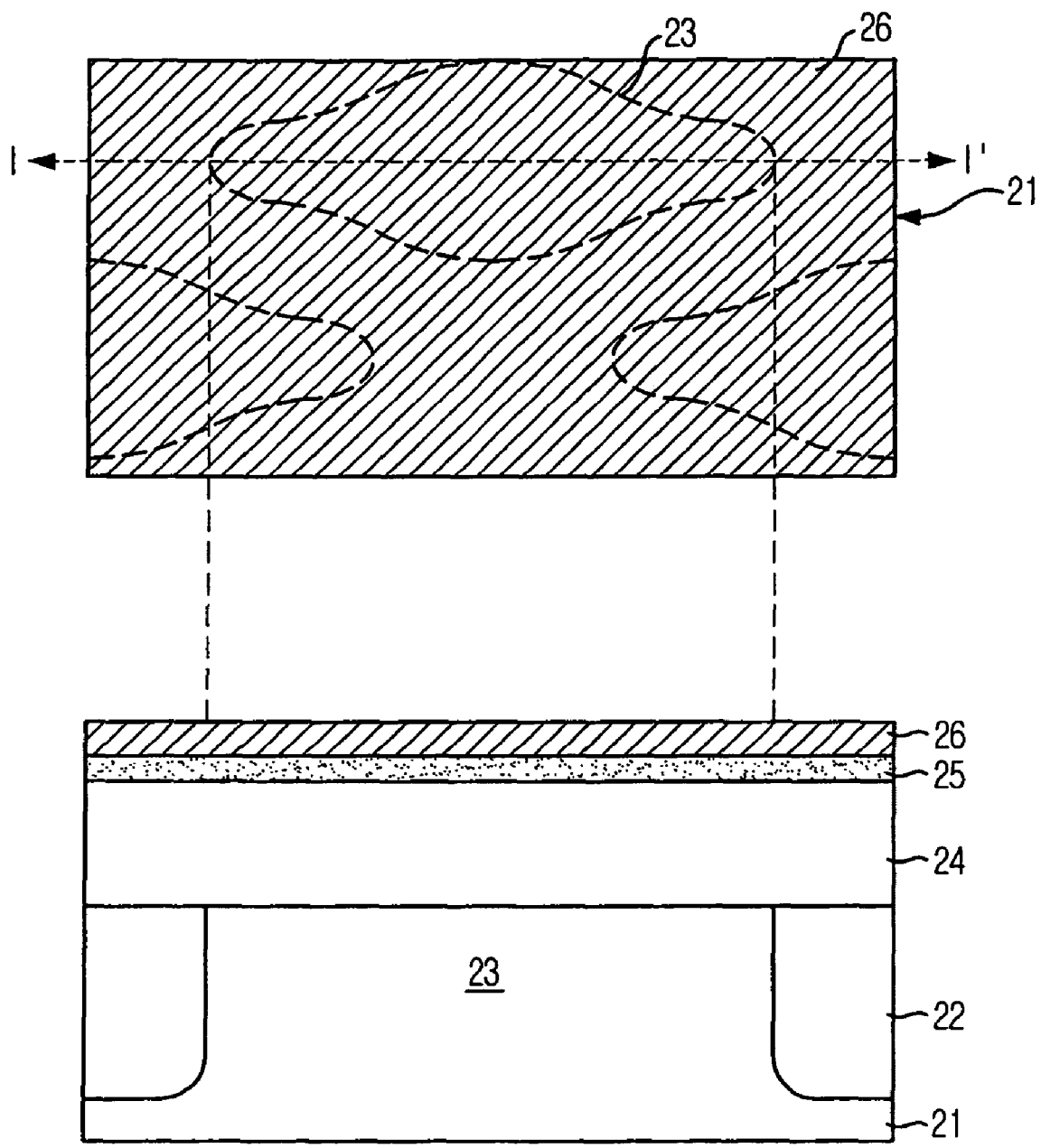

Referring to FIG. 2B, a carbon based hard mask 24 is formed over substrate 21 in which active region 23 is defined. Carbon based hard mask 24 may be formed of amorphous carbon layer. The thickness of carbon based hard mask 24 may range from approximately 1,000 Å to approximately 2,000 Å. A silicon oxide ($SiO_2$) layer (not shown) having a thickness less than approximately 100 Å may be formed under carbon based hard mask 24 to protect substrate 21 from damage even though carbon based hard mask 24 may be wholly removed during a subsequent etch process. Carbon based hard mask 24 acts as a hard mask in patterning substrate 21 for forming a recess pattern.

An oxide based hard mask 25 is formed on carbon based hard mask 24. Oxide based hard mask 25 may be formed of silicon oxynitride (SiON) or silicon oxide ($SiO_2$) with a thickness in a range of approximately 200 Å to approximately 600 Å. A silicon based hard mask 26 is formed on oxide based hard mask 25. Silicon based hard mask 26 may be formed of amorphous silicon or polysilicon with a thickness in range of approximately 200 Å to approximately 400 Å.

Oxide based hard mask 25 and silicon based hard mask 26 act as hard masks in a subsequent process of etching carbon based hard mask 24. Consistent with an embodiment of the present invention, the hard mask for forming the recess gate is a triple structured hard mask pattern comprising carbon based hard mask 24, oxide based hard mask 25, and silicon based hard mask 26.

Figure 2C:
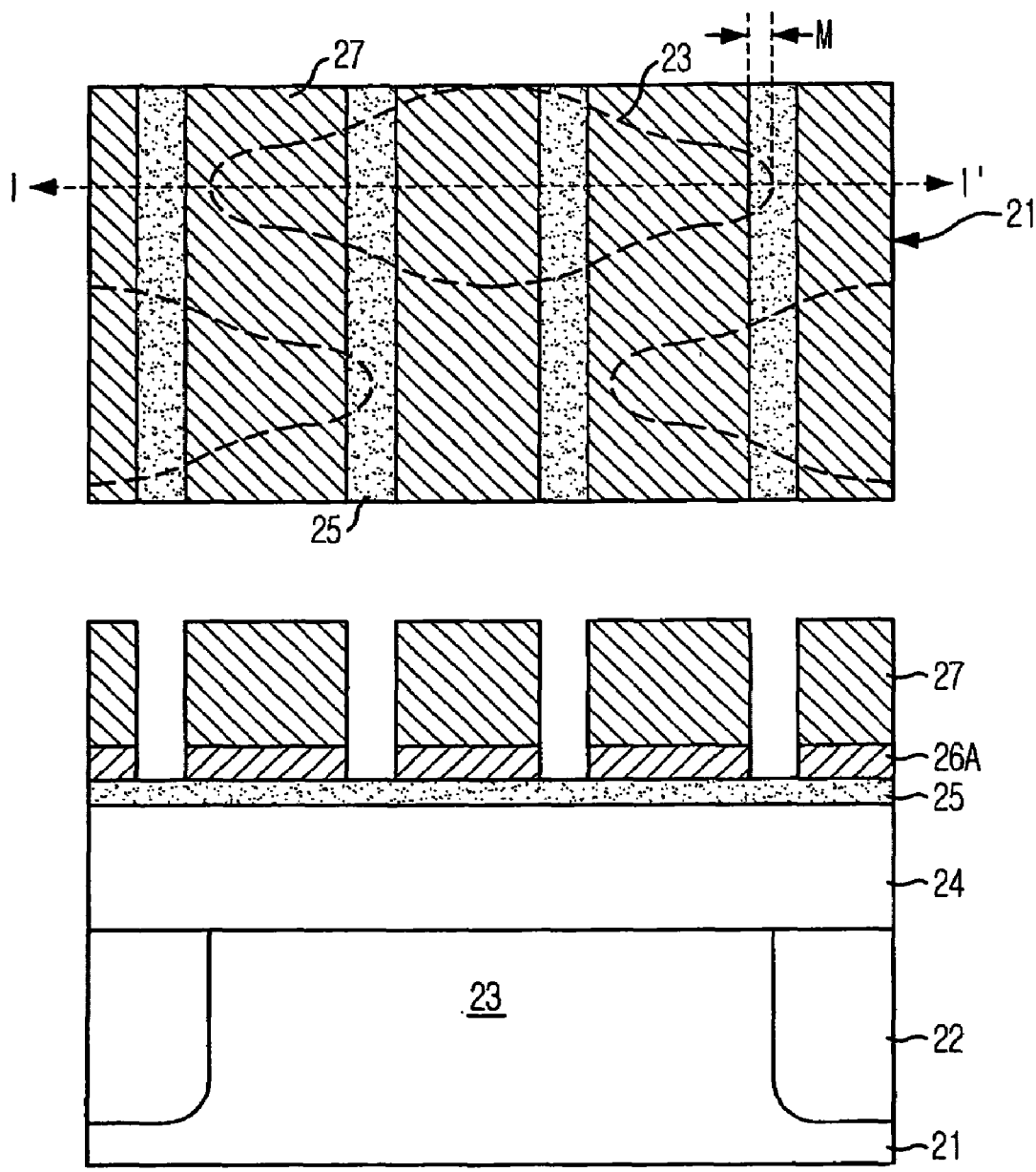

Referring to FIG. 2C, a first photoresist pattern 27, acting as a recess mask, having a straight line pattern with spacing therebetween is formed by coating, exposing, and developing a photoresist. In the present invention, a misalignment (see M of FIG. 2C) between active region 23 and first photoresist pattern 27 is not a serious limitation because active region 23 where the misalignment exists is not etched, which will be illustrated in detail below.

Afterwards, silicon based hard mask 26 is selectively dry-etched using first photoresist pattern 27. Since silicon based hard mask 26 has a high etch selectivity with respect to oxide based hard mask 25, it is easy to pattern silicon based hard mask 26 without simultaneously etching oxide based hard mask 25.

Through the dry-etching of silicon based hard mask 26, a silicon based hard mask pattern 26A having a straight line pattern with spacing therebetween similar to the shape of first photoresist pattern 27 is formed, and partially exposing oxide based hard mask 25.

Figure 2E:
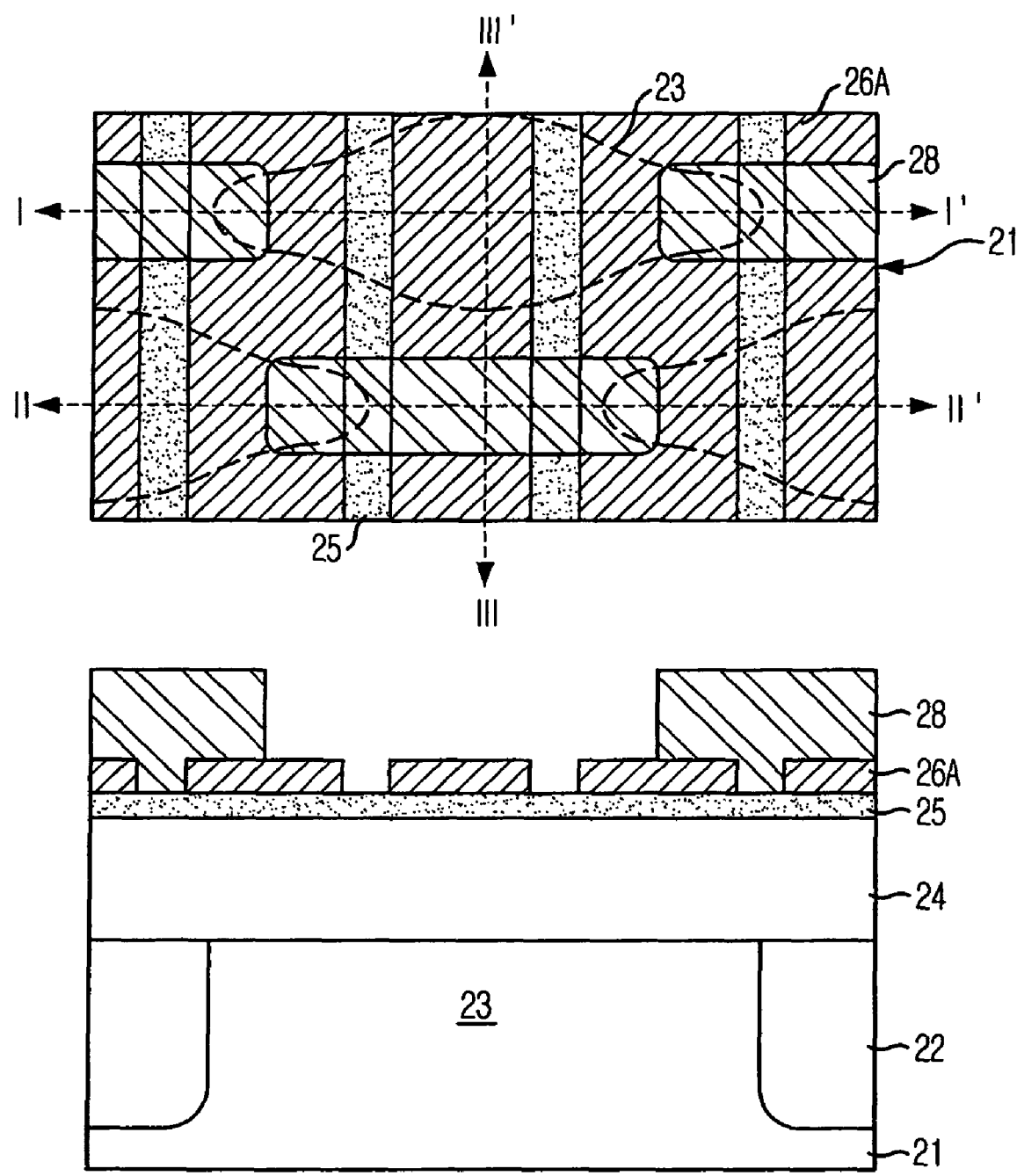
Figure 21:
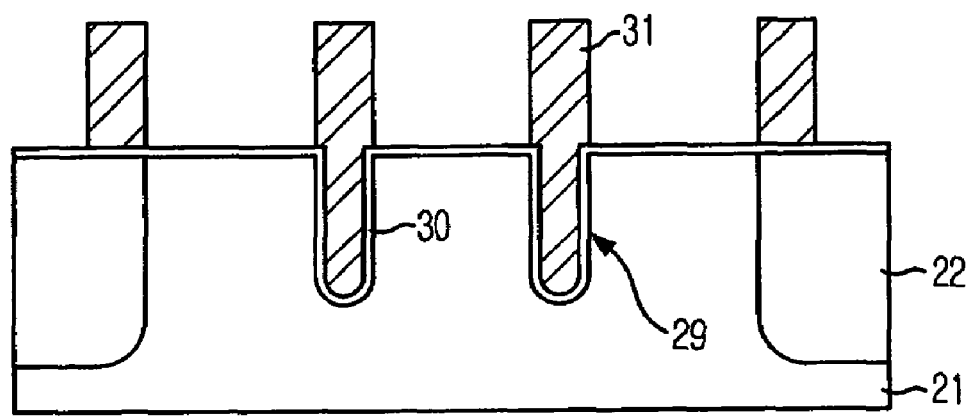

Referring to FIG. 2D, first photoresist pattern 27 is removed to expose silicon based hard mask pattern 26A. Referring to FIG. 2E, a second photoresist pattern 28 is formed on a certain region of the resultant structure by coating, exposing, and developing a photoresist. Second photoresist pattern 28 covers the field oxide layer which a passing gate passes over. That is, second photoresist pattern 28 is formed in the shape of an island such that second photoresist pattern 28 covers facing ends of neighboring active regions 23 adjacent to a gate electrode and field oxide layer 22 between neighboring active regions 23.

In detail, in the direction of line II-II', second photoresist pattern 28 covers the field oxide layer between neighboring active regions 23, and second photoresist pattern 28 is partially overlapped with the facing ends of neighboring active regions 23. In the direction of line III-III', second photoresist pattern 28 is formed only over field oxide layer 22 between neighboring active regions 23, and partially opens field oxide layer 22 which is directly adjacent to active region 23.

Consequently, active region 23 where the recess pattern is formed and a portion of field oxide layer 22 adjacent to active region 23 are exposed by second photoresist pattern 28, but a portion of field oxide layer which the passing gate passes over is still covered with second photoresist pattern 28. Silicon based hard mask pattern 26A is then selectively exposed under second photoresist pattern 28. Silicon based hard mask pattern 26A exposes a region where the recess pattern is formed.

Referring to FIG. 2F, oxide based hard mask 25 exposed by silicon based hard mask 26A is dry-etched using second photoresist pattern 28 as an etch barrier. Subsequently, carbon based hard mask 24 under oxide based hard mask 25 is dry-etched. Second photoresist pattern 28 is also etched away after the dry-etching of carbon based hard mask 24 is completed. Thus, second photoresist pattern 28 does not remain after the dry-etching of carbon based hard mask 24. In FIG. 2F, a dotted line above silicon based hard mask 26A represents the removed second photoresist pattern after performing the dry-etch. When the series of etching processes are completed, a stacked hard mask pattern 100 remains, comprising carbon based hard mask pattern 24A, oxide based hard mask pattern 25A, and silicon based hard mask pattern 26A.

The portion of the active region where the recess pattern is formed is uncovered by carbon based hard mask pattern 24A but the portion where passing gate P passes is covered with stacked hard mask pattern 100 because carbon based hard mask pattern 24A and oxide based hard mask pattern 25A are still left remaining.

Referring to FIG. 2G, the exposed active region 23 is selectively dry-etched using stacked hard mask pattern 100 as an etch barrier to form a recess pattern 29. Then, silicon based hard mask pattern 26A and oxide based hard mask pattern 25A are etched away when active region 23 is etched. In FIG. 2G, a dotted line represents the removed silicon based hard mask pattern 26A and oxide based hard mask pattern 25A after performing the dry-etch process.

After the recess pattern is formed, only carbon based hard mask pattern 24A exists over substrate 21, which means that carbon based hard mask pattern 24A is used as a hard mask in forming recess pattern 29. Carbon based hard mask pattern 24A partially remains over the portion where passing gate P passes, which makes it possible to prevent the loss of the field oxide layer where passing gate P passes.

Because of the remaining carbon based hard mask pattern 24A, an etch loss 29A occurs only at field oxide layer 22 adjacent to recess pattern 29. That is, since the portion of field oxide layer 22 over which passing gate P passes is covered with carbon based hard mask pattern 24A, field oxide layer 22 is effectively protected from loss. The portion of field oxide layer 22 covered with carbon based hard mask pattern 24A is the portion that has an effect on the active region to which the storage node is connected.

Meanwhile, referring to the plan view of FIG. 2G, carbon based hard mask pattern 24A exposes only the region where recess pattern 29 is formed and the portion 29A of field oxide layer 22 adjacent thereto, but covers the other regions over field oxide layer 22. Consequently, the facing ends of neighboring active regions 23 along the same axis are covered with carbon based hard mask pattern 24A so that the covered regions are not etched.

Referring to FIG. 2H, carbon based hard mask pattern 24A is removed. Carbon based hard mask pattern 24A may be formed of amorphous carbon layer so that carbon based hard mask pattern 24A can be removed through a conventional photoresist removal process using oxygen plasma. As a result, recess pattern 29 is formed to a certain depth in active region 23, and an etch loss does not occur at the portion of field oxide layer 22 where passing gate P passes but there is etch loss 29A only at the portion adjacent to recess pattern 29.

FIG. 2I illustrates a gate electrode formed in an embodiment consistent with the present invention. A gate insulating layer 30 is formed on the entire surface of the resultant structure where the recess pattern is formed. Thereafter, a deposition process of a conductive layer for a gate electrode 31 and a gate-patterning process are performed to complete the recess gate process. Gate electrode 31 is formed such that gate electrode 31 covers recess pattern 29. Recess pattern 29 under gate electrode 31 provides a channel, which is referred to as a recess channel. Thus, the channel length increases compared with a typical planar channel.

Figure 3:
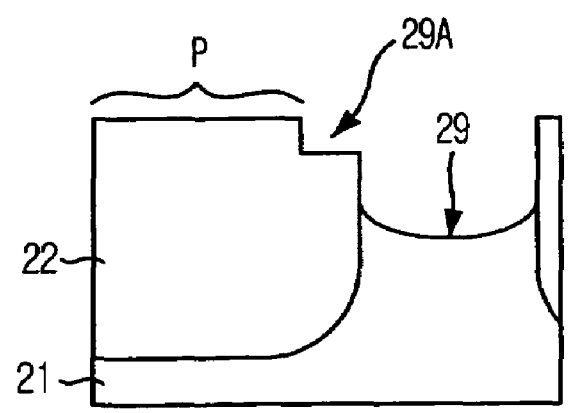
FIG. 3 is a sectional view taken along line IV-IV' of FIG. 2H.

FIG. 3 is a sectional view taken along the line IV-IV' of FIG. 2H. There is no etch loss at the portion of field oxide layer 22 where passing gate P passes but etch loss 29A occurs at the portion adjacent to recess pattern 29, i.e., between passing gate P and recess pattern 29.

Consistent with an embodiment of the present invention, it is possible to prevent etch loss of the field oxide layer under the passing gate by using second photoresist pattern 28 having the island shape. It is further possible to prevent physical damage to the active region to which the storage node is connected even though a partial overlay misalignment exists between the active region and the recess pattern.

Although second photoresist pattern 28 is formed to cover the portion of the field oxide layer where the passing gate passes, the second photoresist pattern may be formed to cover all the field oxide layer, i.e., the whole region of the field oxide layer where the passing gate passes, except the region where the recess pattern, is formed by controlling the exposure process consistent with another embodiment. When performing the etch process after forming the photoresist pattern to cover the entire field oxide layer where the passing gate passes, it is possible to prevent etch loss of the entire field oxide layer under the portion where the passing gate passes in forming the recess pattern.

FIGS. 4A to 4J illustrate a method for manufacturing a recess gate consistent with another embodiment of the present invention. In FIGS. 4A to 4J, top diagrams are plan views and bottom diagrams are sectional views taken along the line I-I' of the plan view.

Figure 4A:
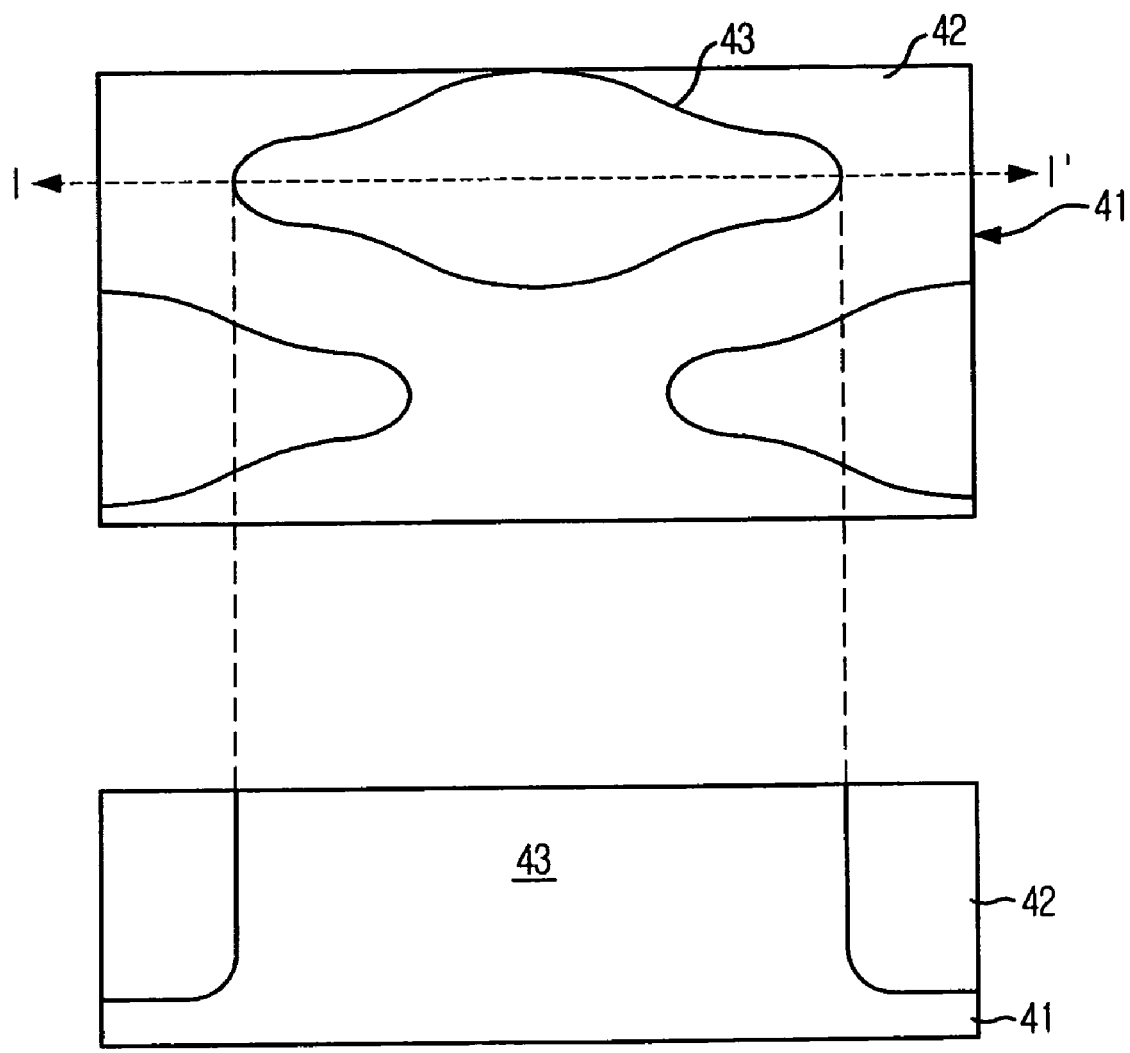

Referring to FIG. 4A, a field oxide layer 42 is formed on a substrate 41 using a shallow trench isolation (STI) process. Field oxide layer 42 defines an active region 43, wherein active region 43 is formed in the shape of an island having a major axis and a minor axis. In the plan view, line I-I' is parallel to the major axis of active region 43, and a recess gate passes over active region 43 in the minor axis direction, which will be illustrated later.

Figure 4B:
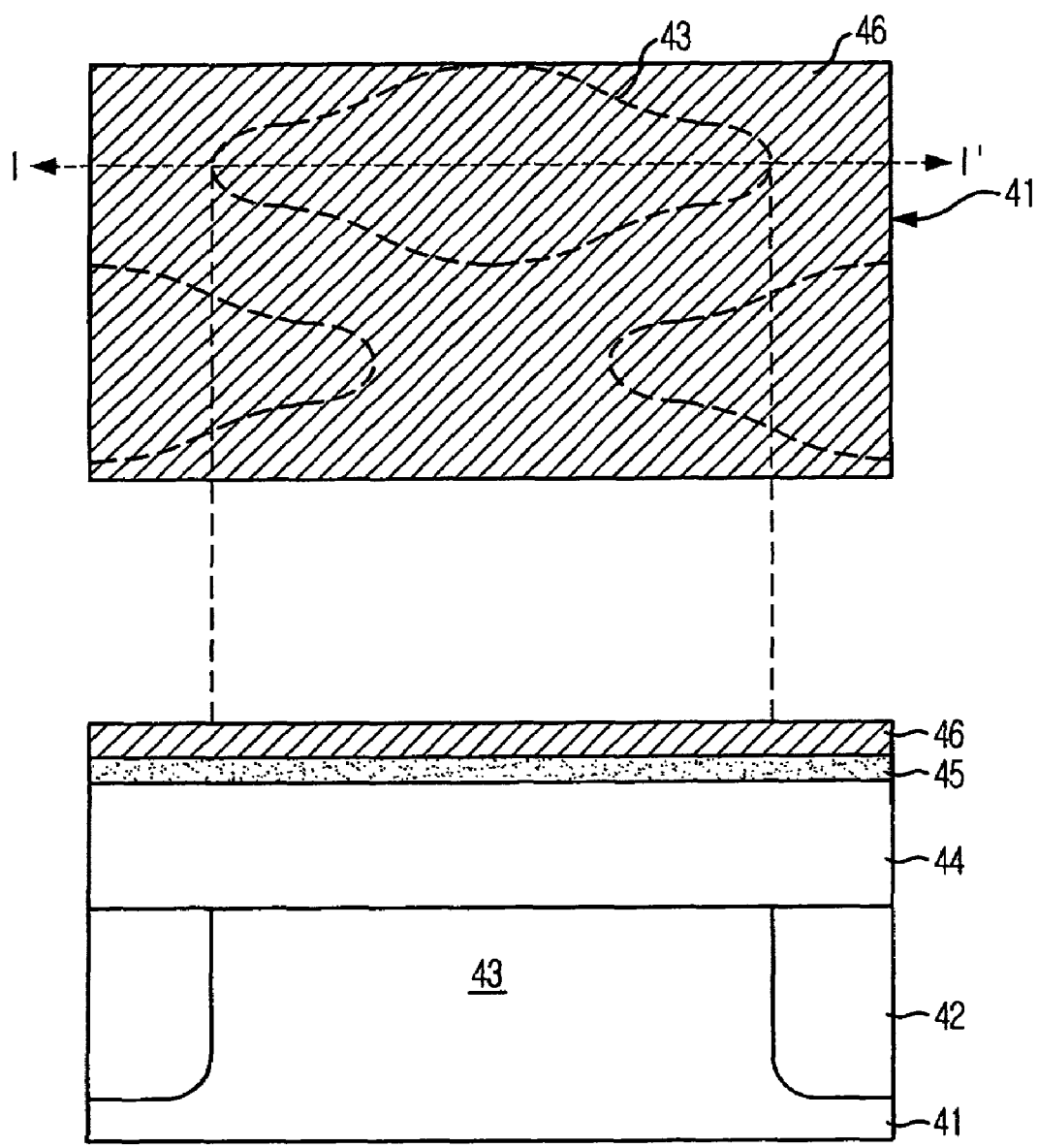

Referring to FIG. 4B, a carbon based hard mask 44 is formed over substrate 41 in which active region 43 is defined. Carbon based hard mask 44 may comprise an amorphous carbon layer. The thickness of carbon based hard mask 44 may range from approximately 1,000 Å to approximately 2,000 Å. A silicon oxide ($SiO_2$) layer having a thickness less than approximately 100 Å may be formed under carbon based hard mask 44 to protect substrate 41 from damage even though carbon based hard mask 44 may be wholly removed during a subsequent etch process. Carbon based hard mask 44 acts as a hard mask in patterning substrate 41 for forming a recess pattern.

An oxide based hard mask 45 is formed on carbon based hard mask 44. Oxide based hard mask 45 may be formed of silicon oxynitride (SiON) or silicon oxide ($SiO_2$) with a thickness in range of approximately 200 Å to approximately 600 Å. A silicon based hard mask 46 is formed on oxide based hard mask 45. Silicon based hard mask 46 may be formed of amorphous silicon or polysilicon with a thickness in range of approximately 200 Å to approximately 400 Å.

Oxide based hard mask 45 and silicon based hard mask 46 act as hard masks in a subsequent process of etching carbon based hard mask 44. Consistent with an embodiment of the present invention, the hard mask for forming a bulb-shaped recess gate is a triple hard mask including carbon based hard mask 44, oxide based hard mask 45, and silicon based hard mask 46.

Figure 4C:
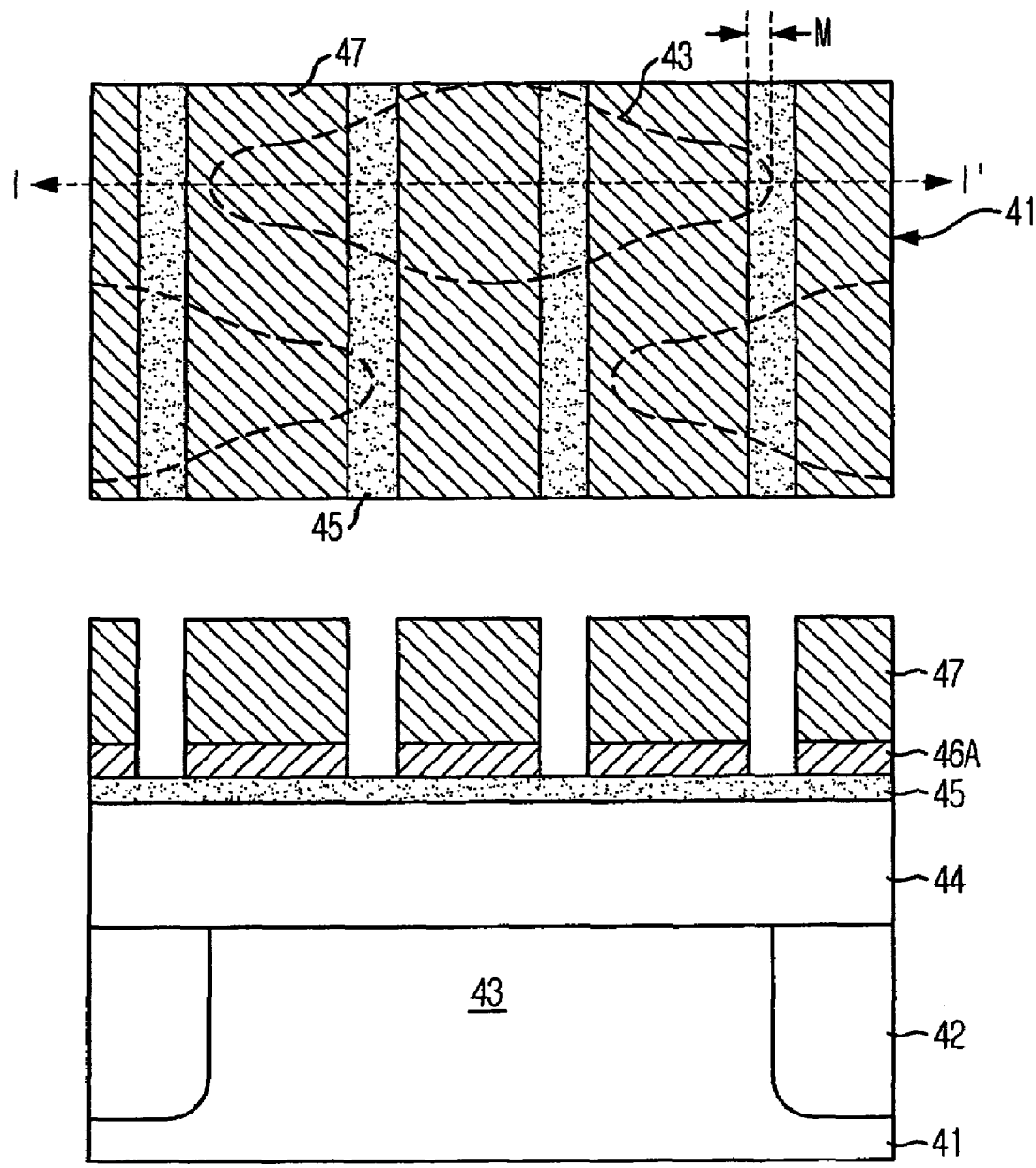

Referring to FIG. 4C, a first photoresist pattern 47 having a straight line pattern with spacing therebetween is formed by coating, exposing, and developing a photoresist. In the present invention, a misalignment (see M of FIG. 4C) between active region 43 and first photoresist pattern 47 is not a serious limitation because active region 43 where the misalignment exists is not etched, which will be illustrated in detail below.

Silicon based hard mask 46 is selectively dry-etched using first photoresist pattern 47. Since silicon based hard mask 46 has a high etch selectivity with respect to oxide based hard mask 45, it is easy to pattern silicon based hard mask 46. Through the dry-etching of silicon based hard mask 46, a silicon based hard mask pattern 46A having a straight line with spacing pattern similar to the shape of first photoresist pattern 47 is formed. Accordingly, oxide based hard mask 45 is partially exposed.

Referring to FIG. 4D, first photoresist pattern 47 is removed to expose silicon based hard mask pattern 46A. Because first photoresist pattern 47 is formed of photoresist, first photoresist pattern 47 is removed using a conventional photoresist removal process.

Figure 4E:
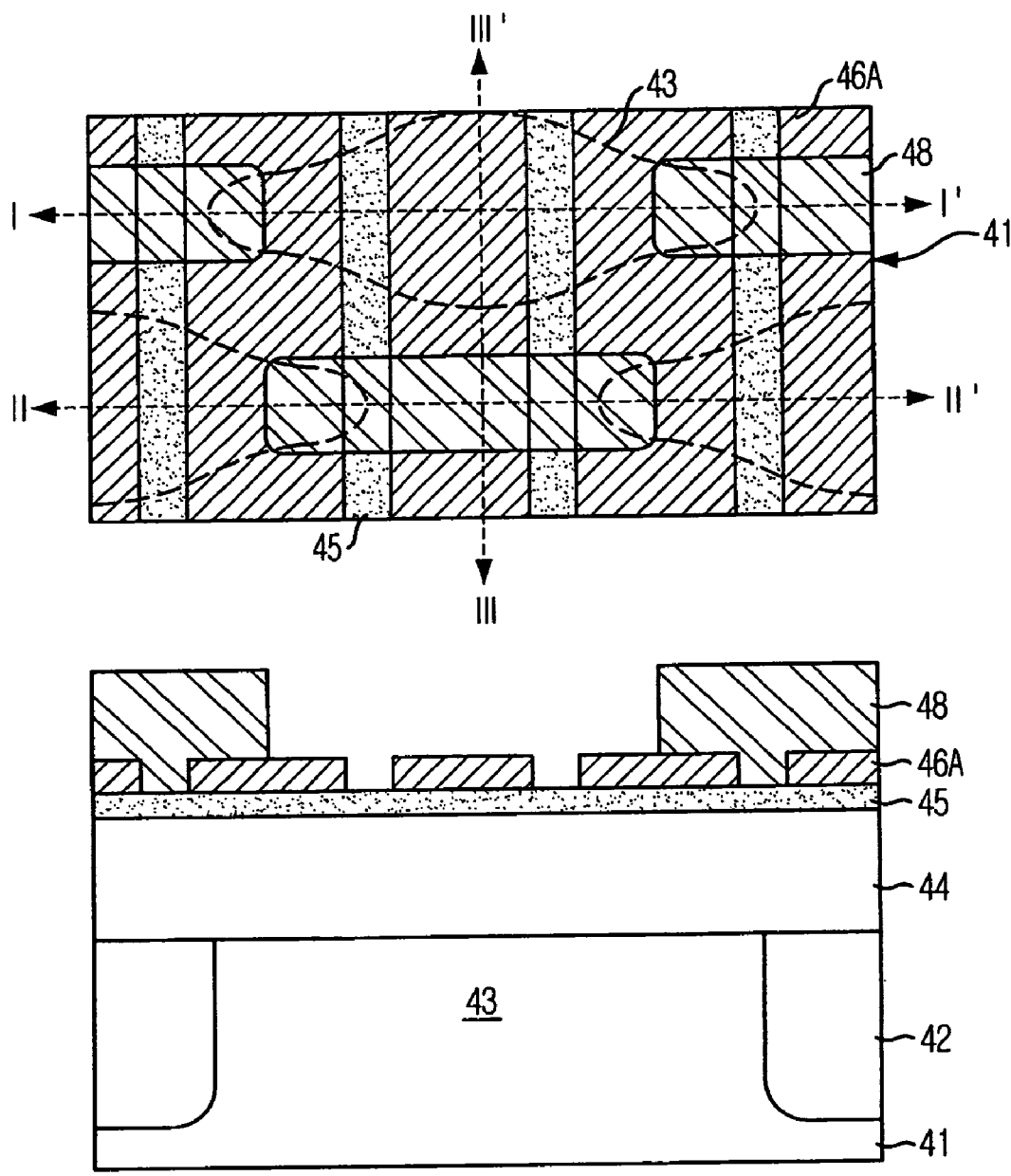

Referring to FIG. 4E, a second photoresist pattern 48 is formed on a certain region of the resultant structure by coating, exposing, and developing a photoresist. Second photoresist pattern 48 covers the field oxide layer which a passing gate passes over. That is, second photoresist pattern 48 is formed in the shape of an island such that second photoresist pattern 48 covers facing ends of neighboring active regions 43 adjacent to a gate electrode and field oxide layer 42 between neighboring active regions 43.

Specifically, in the direction of line II-II', the second photoresist pattern 48 covers the field oxide layer between neighboring active regions 43, and also, second photoresist pattern 48 is partially overlapped with the facing ends of neighboring active regions 43. In the direction of line III-III, second photoresist pattern 48 is formed only over field oxide layer 42 between neighboring active regions 43, and partially opens field oxide layer 42 which is directly adjacent to active region 43.

Consequently, active region 43 where the recess pattern is formed and a portion of field oxide layer 42 adjacent to active region 43 are exposed by second photoresist pattern 48, but a portion of field oxide layer which the passing gate passes over is still covered with second photoresist pattern 48. Silicon based hard mask pattern 46A is then selectively exposed under second photoresist pattern 48. Silicon based hard mask pattern 46A exposes a region where the recess pattern is formed.

Referring to FIG. 4F, oxide based hard mask 45 exposed by silicon based hard mask 46A is dry-etched using second photoresist pattern 48 as an etch barrier. Subsequently, carbon based hard mask 44 under oxide based hard mask 45 is dry-etched. Second photoresist pattern 48 is also etched away after the dry-etching of carbon based hard mask 44 is completed. Thus, second photoresist pattern 48 does not remain after the dry-etching of carbon based hard mask 44. A dotted line above silicon based hard mask 46A represents the removed second photoresist pattern after performing the dry-etch. When the series of etching processes are completed, a stacked hard mask pattern 200 remains, comprising carbon based hard mask pattern 44A, oxide based hard mask pattern 45A, and silicon based hard mask pattern 46A.

The portion of the active region where the recess pattern is formed is uncovered by carbon based hard mask pattern 44A but the portion where passing gate P passes is covered with stacked hard mask pattern 200 because carbon based hard mask pattern 44A and oxide based hard mask pattern 45A still remain.

Referring to FIG. 4G, the exposed active region 43 is selectively dry-etched using stacked hard mask pattern 200 as an etch barrier to form a neck pattern 49. Then, silicon based hard mask pattern 46A and oxide based hard mask pattern 45A are also etched away when active region 43 is etched. In FIG. 4G, a dotted line represents the removed silicon based hard mask pattern 46A and oxide based hard mask pattern 45A after the dry-etch.

After neck pattern 49 is formed, only carbon based hard mask pattern 44A exists over substrate 41, which means that carbon based hard mask pattern 44A is used as a hard mask in forming neck pattern 49. Carbon based hard mask pattern 44A partially remains over the portion where passing gate P passes, which makes it possible to prevent the loss of the field oxide layer where passing gate P passes.

Because of the remaining carbon based hard mask pattern 44A, an etch loss 29A occurs only at field oxide layer 42 adjacent to neck pattern 49. That is, since the portion of field oxide layer 42 over which passing gate P passes is covered with carbon based hard mask pattern 44A, field oxide layer 42 is effectively protected from loss. The portion of field oxide layer 42 covered with carbon based hard mask pattern 44A is the portion that has an effect on the active region to which the storage node is connected.

Meanwhile, referring to the plan view of FIG. 4G, carbon based hard mask pattern 44A exposes only the region where neck pattern 49 is formed and the portion 49A of field oxide layer 42 adjacent thereto, but covers the other regions over field oxide layer 42. Consequently, the facing ends of neighboring active regions 43 along the same axis are covered with carbon based hard mask pattern 44A so that the covered regions are not etched.

The depth of neck pattern 49 may range from approximately 500 Å to approximately 1,500 Å. Generally, a bulb-shaped pattern comprises a neck pattern and a bulb pattern. Thus, after forming the neck pattern, an isotropic etching process is performed to form the bulb-shaped pattern.

Referring to FIG. 4H, a sacrificial layer is deposited on the remaining carbon based hard mask pattern 44A and thereafter the sacrificial layer is dry-etched to form a sacrificial sidewall 50. Sacrificial sidewall 50 prevents sidewalls of neck pattern 49 from damage during an isotropic etching process for forming the bulb-shaped pattern. In detail, sacrificial sidewall 50 is formed by forming an oxide layer to a thickness in range of approximately 50 Å to approximately 200 Å and then dry-etching the oxide layer. The dry-etch for forming sacrificial sidewall 50 may be performed using etch-back process. Therefore, sacrificial sidewall 50 covers the sidewalls of carbon based hard mask pattern 44A as well as the sidewalls of neck pattern 49.

Referring to FIG. 4I, an isotropic dry-etch process is performed using carbon based hard mask pattern 44A as an etch barrier to form a bulb pattern 51. Sacrificial sidewall 50 prevents the sidewalls of neck pattern 49 from damage during the isotropic dry-etch process. Bulb pattern 51 has a round etch profile resulting from the isotropic dry-etch process. Neck pattern 49 has a vertical etch profile. Through the above-described etching processes, a bulb-shaped recess pattern 300 is formed comprising neck pattern 49 and bulb pattern 51.

Referring to FIG. 4J, carbon based hard mask pattern 44A and sacrificial sidewall 50 are removed. Carbon based hard mask pattern 44A may be removed through a conventional photoresist removal process using oxygen plasma. Sacrificial sidewall 50 is formed of oxide so sacrificial sidewall 50 can be removed through a cleaning process using hydrofluoric acid (HF). As a result, bulb-shaped recess pattern 300 comprising neck pattern 49 and bulb pattern 51 is formed in active region 43, and etch loss does not occur at the portion of field oxide layer 42 where passing gate P passes but there is etch loss 49A only at the portion adjacent to neck pattern 49.

Figure 4K:
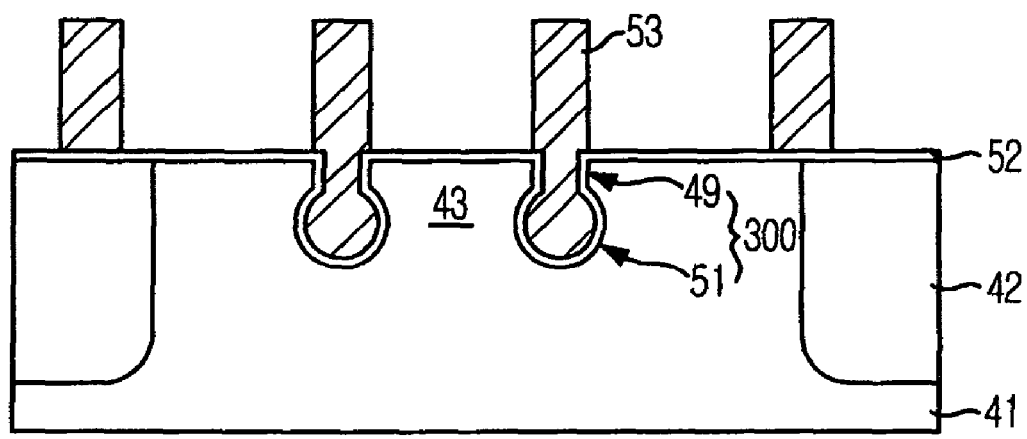
FIG. 4K illustrates a gate electrode formed in an embodiment consistent with the present invention.

FIG. 4K illustrates a gate electrode formed in an embodiment consistent with the present invention. A gate insulating layer 52 is formed on the entire surface of the resultant structure where bulb-shaped recess pattern 300 is formed. Thereafter, a deposition process of a conductive layer for a gate electrode 53 and a gate-patterning process are performed to complete the recess gate process. Gate electrode 53 is formed such that gate electrode 53 covers both neck pattern 49 and bulb pattern 51. Bulb-shaped recess pattern 300 under gate electrode 53 provides a channel. Thus, the channel length is longer than recess pattern 29 of FIG. 2I, discussed above.

Figure 5:
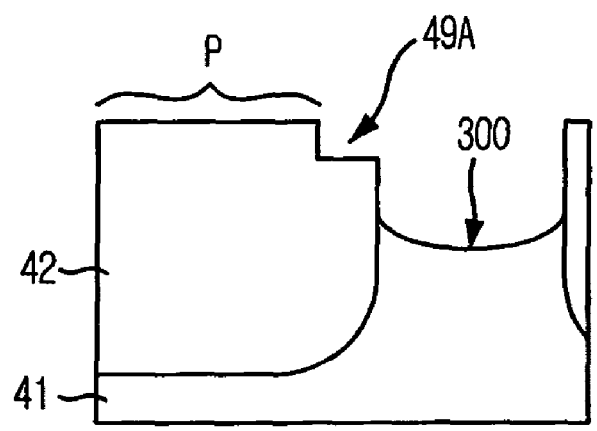
FIG. 5 is a sectional view taken along the line IV-IV' of FIG. 4J.

FIG. 5 is a sectional view taken along the line IV-IV' of FIG. 4J. There is no etch loss at the portion of field oxide layer 42 where passing gate P passes but etch loss 29A occurs at the portion adjacent to bulb-shaped recess pattern 300, i.e., i.e., between passing gate P and bulb-shaped recess pattern 300.

Consistent with an embodiment of the present invention, it is possible to prevent etch loss of the field oxide layer under the passing gate by using second photoresist pattern 48. It is further possible to prevent physical damage to the active region to which the storage node is connected even though a partial overlay misalignment exists between the active region and the bulb-shaped recess pattern.

Although second photoresist pattern 48 is formed to cover the portion of the field oxide layer where the passing gate passes, the second photoresist pattern may be formed to cover all the field oxide layer, i.e., the whole region of the field oxide layer where the passing gate passes, except the region where the recess pattern, is formed by controlling the exposure process consistent with another embodiment. When performing the etch process after forming the photoresist pattern to cover the entire field oxide layer where the passing gate passes, it is possible to prevent etch loss of the entire field oxide layer under the portion where the passing gate passes in forming the recess pattern.

As described above, the present invention provides a method of preventing the etch loss of the field oxide layer under the passing gate in a process of forming the recess gate or the bulb-shaped recess gate, and preventing silicon of the storage node from physical damage even though a partial overlay misalignment exists between the active region and the bulb-shaped recess pattern.

While the present invention has been described with respect to several embodiments, it will be apparent to those skilled in the art that various changes and modifications may be made without departing from the spirit and scope of the invention as defined in the following claims.

What is claimed is:

1. A method for manufacturing a recess gate in a semiconductor device, the method comprising:
   forming a field oxide layer on a substrate to define a plurality of active regions;
   forming a hard mask pattern over the substrate to selectively expose at least a portion of at least one of the active regions;
   forming a neck pattern in the at least one active region through an etching process using the hard mask pattern as an etch barrier;
   forming a sacrificial sidewall on sidewalls of the neck pattern and the hard mask pattern;
   forming a bulb pattern under the neck pattern through an etching process using the hard mask pattern;
   removing the sacrificial sidewall and the hard mask pattern;
   forming a gate insulating layer over the substrate; and
   forming a gate electrode over the gate insulating layer to fill at least the neck pattern and the bulb pattern,
   wherein forming the hard mask pattern includes forming the hard mask pattern to cover facing ends of neighboring active regions adjacent to the gate electrode and the field oxide layer between the neighboring active regions.

2. The method of claim 1, wherein the hard mask pattern comprises a triple structured hard mask pattern.

3. The method of claim 2, wherein forming of the triple structured hard mask pattern comprises:
   forming a carbon based hard mask and an oxide based hard mask;
   forming a silicon based hard mask pattern having a straight line pattern with spacing therebetween over the oxide based hard mask;
   forming an island-shaped photoresist pattern over the silicon based hard mask pattern to cover the facing ends of the neighboring active regions and the field oxide layer therebetween; and
   etching the oxide based hard mask and the carbon based hard mask using the island-shaped photoresist pattern and the silicon based hard mask pattern as an etch barrier.

4. The method of claim 3, wherein the forming of the silicon based hard mask pattern comprises:
   forming a silicon based hard mask over the oxide based hard mask;
   forming a photoresist pattern having a straight line pattern with spacing therebetween over the silicon based hard mask;
   etching the silicon based hard mask using the photoresist pattern as an etch barrier to form the silicon based hard mask pattern; and
   removing the photoresist pattern.

5. The method of claim 3, wherein the carbon based hard mask includes an amorphous carbon layer.

6. The method of claim 3, wherein the carbon based hard mask is formed to have a thickness in a range of approximately 1,000 Å to approximately 2,000 Å.

7. The method of claim 3, further comprising forming an oxide layer with a thickness less than approximately 100 Å between the carbon based hard mask and the substrate.

8. The method of claim 3, wherein the oxide based hard mask includes silicon oxynitride or silicon oxide.

9. The method of claim 3, wherein the oxide based hard mask is formed to have a thickness in a range of approximately 200 Å to approximately 600 Å.

10. The method of claim 3, wherein the silicon based hard mask includes amorphous silicon or polysilicon.

11. The method of claim 3, wherein the silicon based hard mask is formed to a thickness in range of approximately 200 Å to approximately 400 Å.

12. The method of claim 1, wherein the forming of the sacrificial sidewall comprises:
   forming an oxide layer over the carbon based hard mask including the neck pattern; and
   performing an etch back process to leave the oxide layer remaining on the sidewalls of the neck pattern and the hard mask pattern.

* * * * *